(12) United States Patent
Ogishima et al.

(10) Patent No.: US 6,734,479 B1
(45) Date of Patent: May 11, 2004

(54) SEMICONDUCTOR INTEGRATED CIRCUIT DEVICE AND THE METHOD OF PRODUCING THE SAME

(75) Inventors: Atsushi Ogishima, Tachikawa (JP); Kiyonori Ohyu, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/452,173

(22) Filed: Dec. 1, 1999

(30) Foreign Application Priority Data

Dec. 1, 1998 (JP) ............................................ 10-341599

(51) Int. Cl.$^7$ ............................................ H01L 27/108
(52) U.S. Cl. ..................... 257/296; 257/298; 257/300; 257/303; 257/306; 257/314
(58) Field of Search ................................ 257/296–310, 257/314

(56) References Cited

U.S. PATENT DOCUMENTS 6,066,880 A  *  5/2000  Kusunoki ................... 257/408
6,362,042 B1  *  3/2002  Hosotani et al.

FOREIGN PATENT DOCUMENTS

| JP | 2-214155 | 8/1990 |
| JP | 4-58556 | 2/1992 |
| JP | 9-36318 | 2/1997 |

* cited by examiner

*Primary Examiner*—Fetsum Abraham
(74) *Attorney, Agent, or Firm*—Antonelli, Terry, Stout & Kraus, LLP

(57) ABSTRACT

In a semiconductor integrated circuit device having a memory cell which includes a MIS.FET and a capacitance element, the conductivity type of a low-resistance polysilicon film which constitutes the gate electrode (5g) of the memory cell selecting MIS.FET (Q) of n-channel type constituting the memory cell is set at p$^+$-type in order to enhance the refresh characteristics of the memory cell.

19 Claims, 38 Drawing Sheets

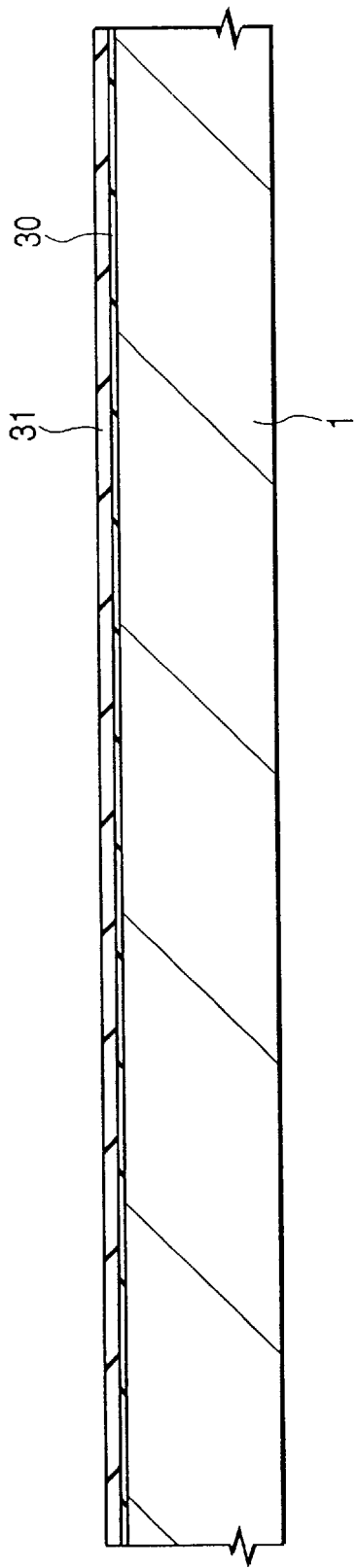
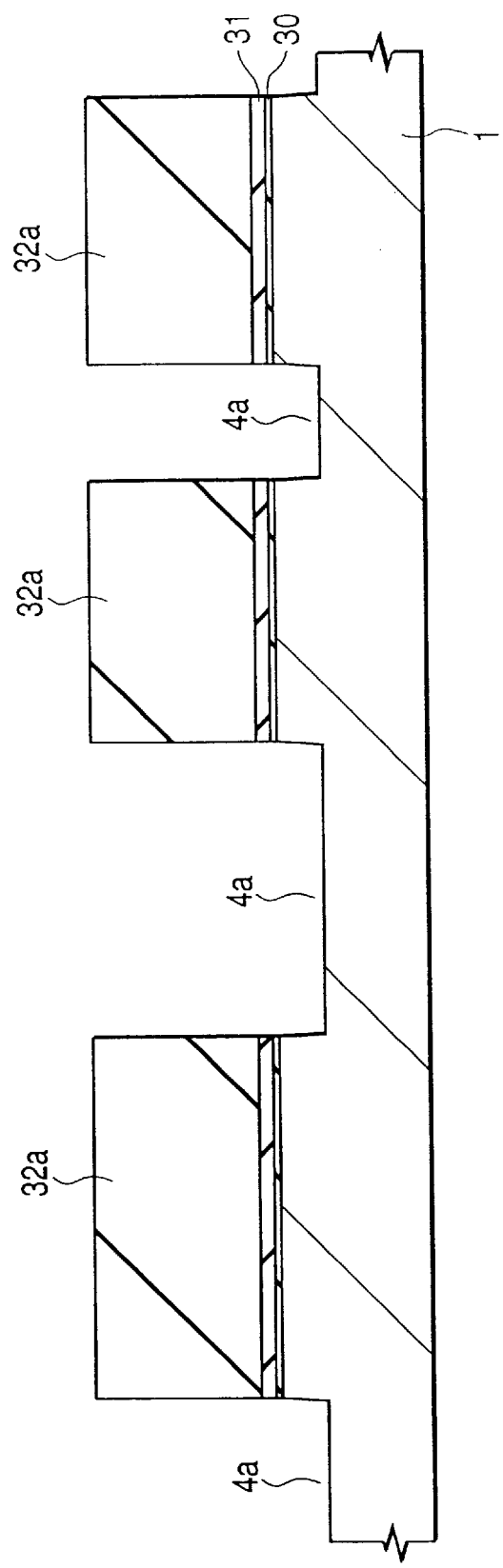

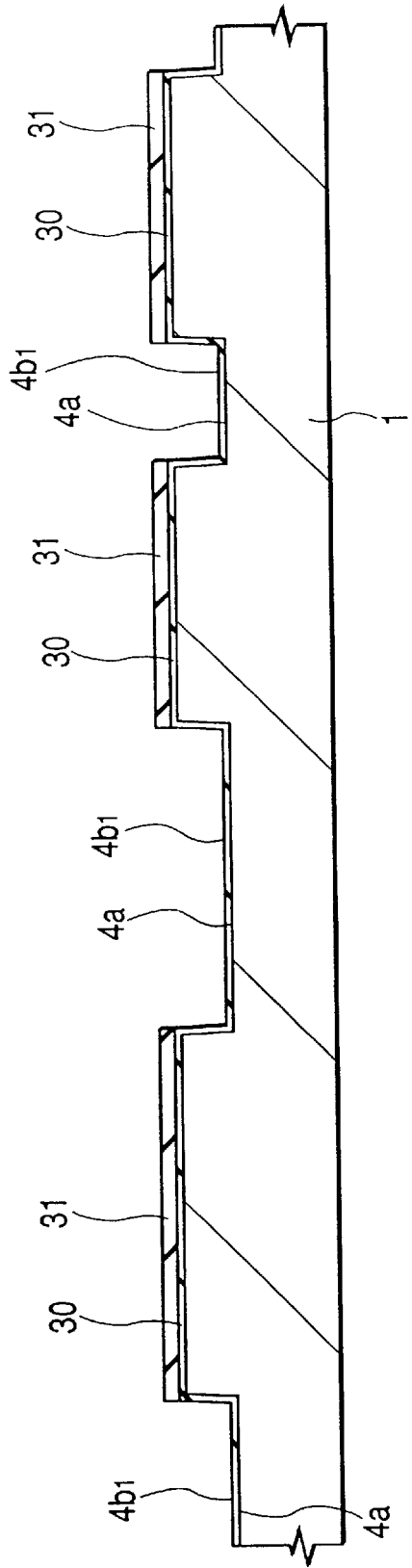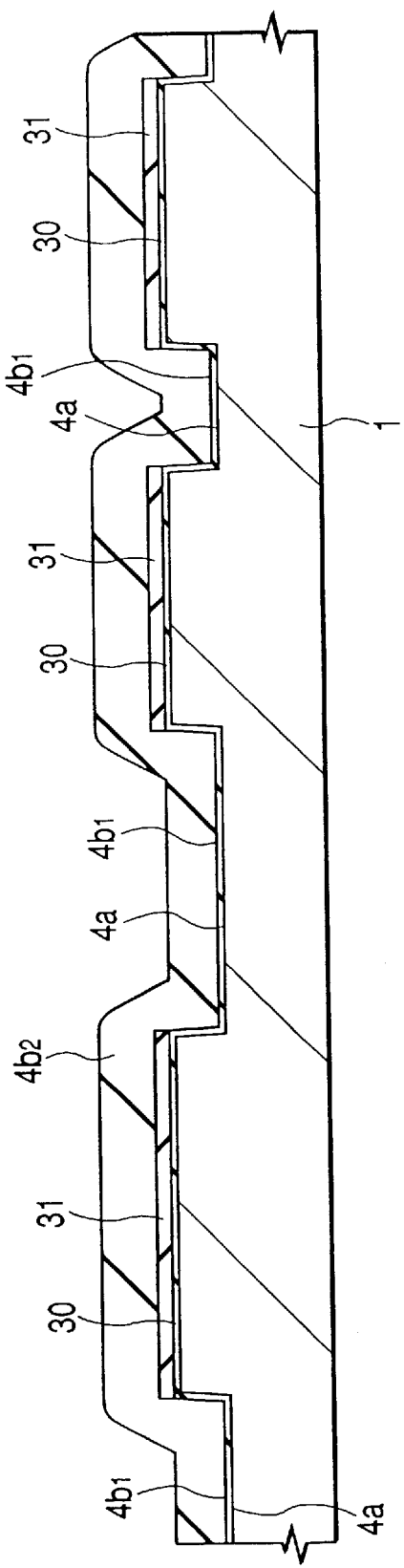

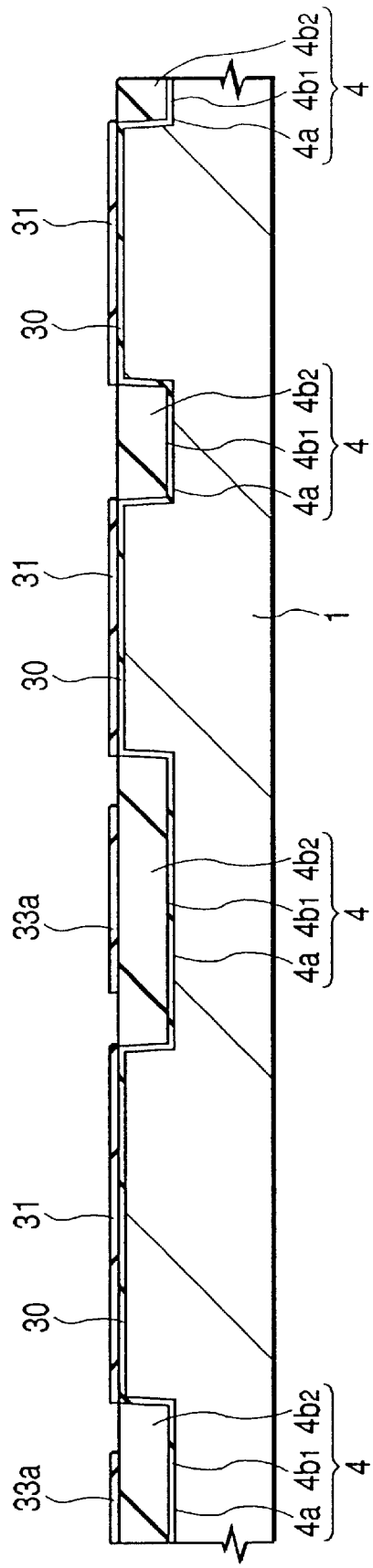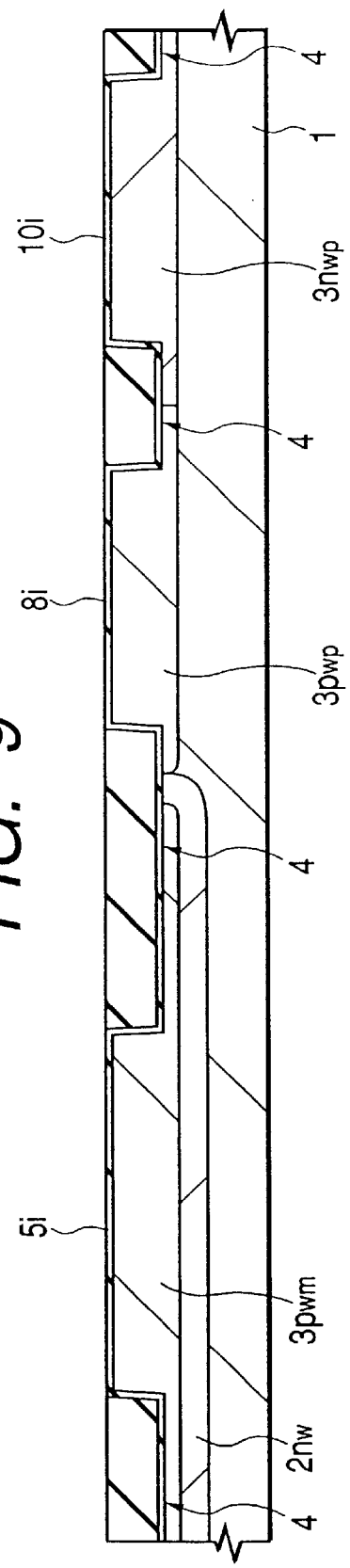

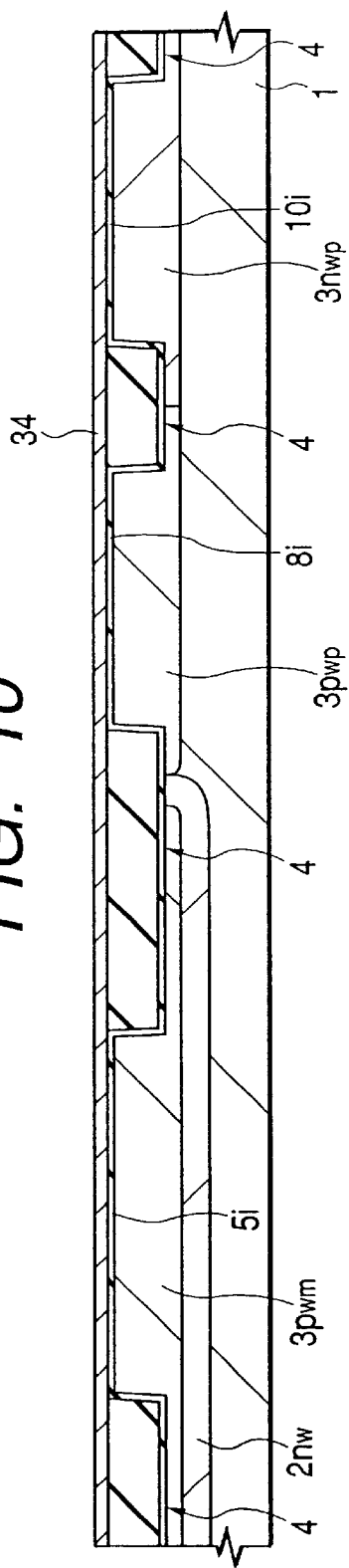
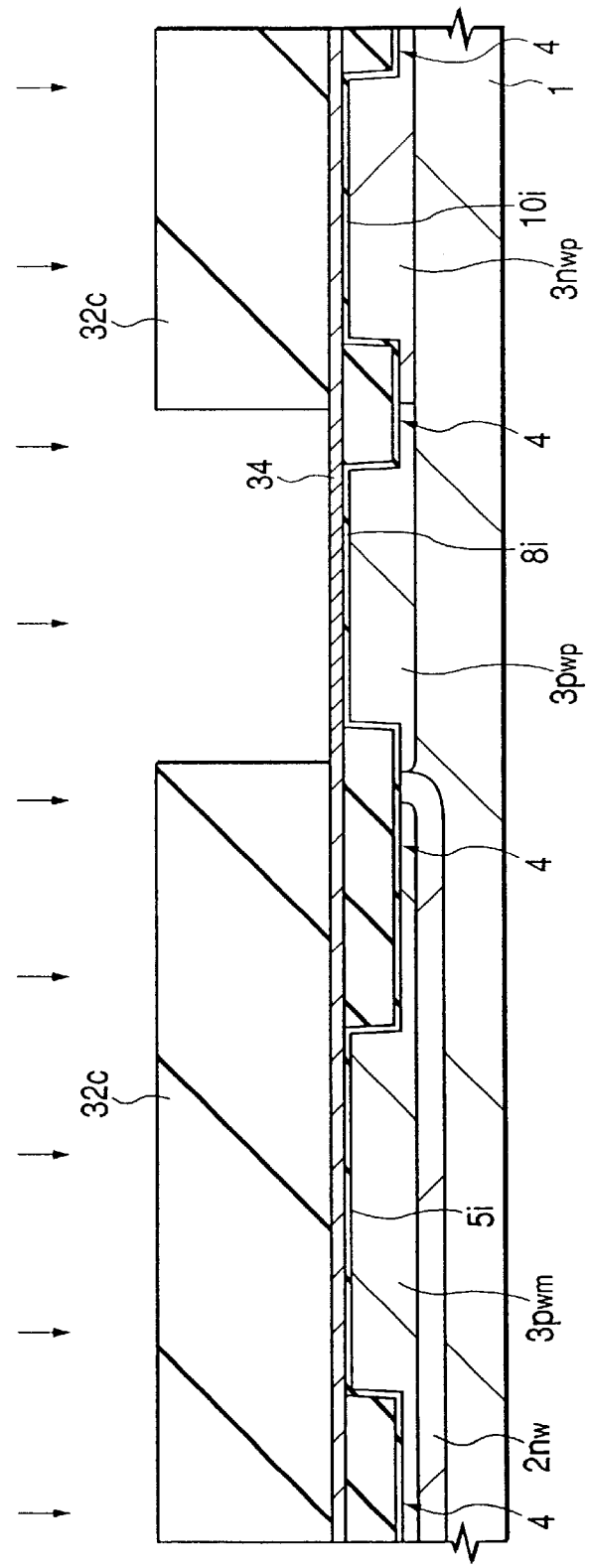

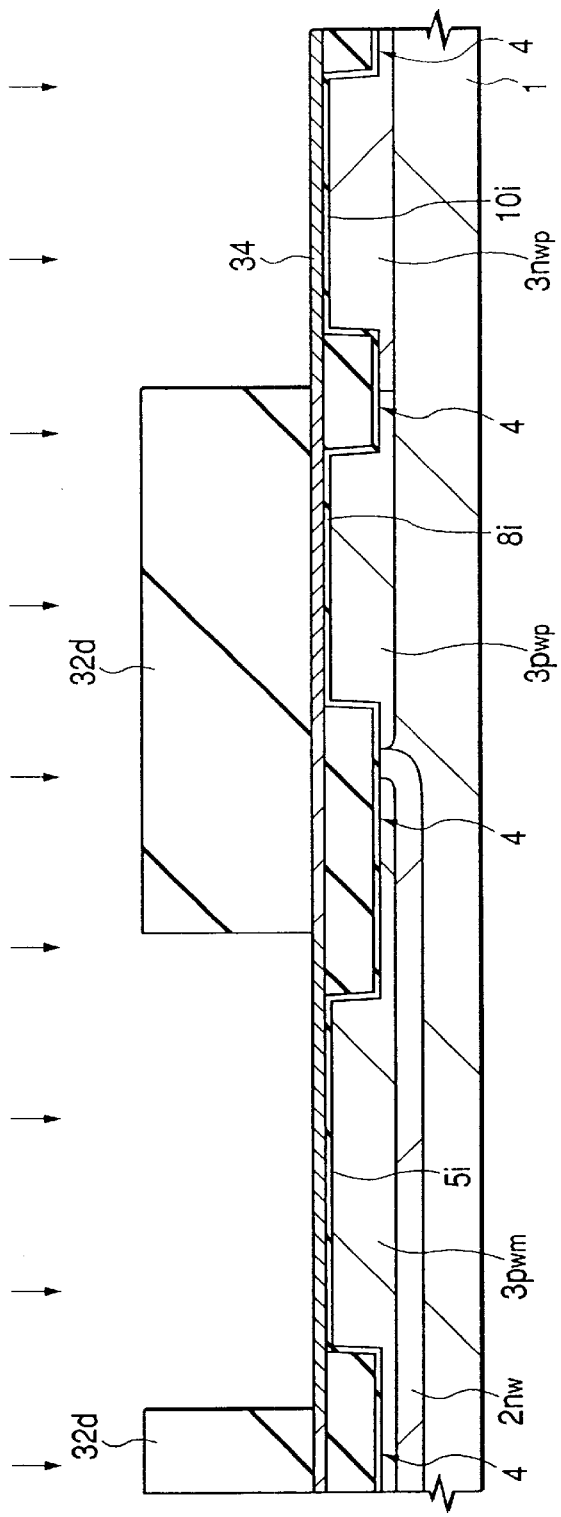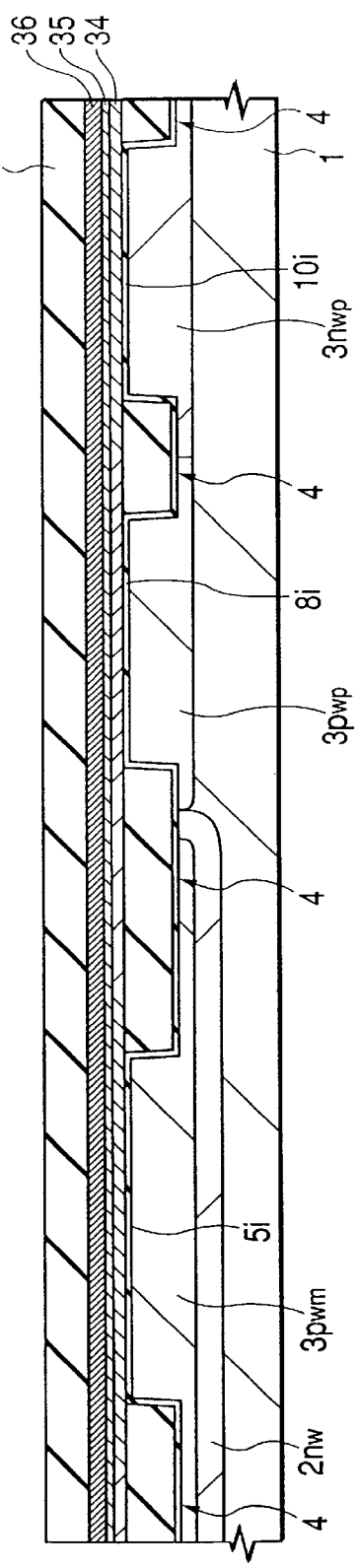

SEMICONDUCTOR INTEGRATED CIRCUIT DEVICE AND THE METHOD OF PRODUCING THE SAME

BACKGROUND OF THE INVENTION

The present invention relates to a semiconductor integrated circuit device and to technology for producing the same. More particularly, it relates to techniques which are effective when applied to a semiconductor integrated circuit device having a logic (logic circuit)/memory hybrid type memory wherein a memory circuit and a logic circuit are fabricated on an identical semiconductor substrate, and to technology for producing the semiconductor integrated circuit device.

In recent years, logic/memory hybrid type memories in which a DRAM (Dynamic Random Access Memory) and a logic circuit are fabricated on an identical semiconductor substrate have been developed and produced.

Each memory cell of the DRAM includes one MIS (Metal-Insulator-Semiconductor) transistor for selecting the memory cell, and one capacitor connected in series with the MIS transistor. Herein, the capacitor is employed as an element in which information is stored. Accordingly, when the capacitor is allowed to stand, signal charges for storing the information leak with the lapse of time until the stored data is lost.

In the DRAM, therefore, a so-called "refresh operation" is required, in which the stored content is cyclically refreshed for retaining the information stored in the memory cell. With enhancement in the operating speed of the overall DRAM, various researches and technical developments have been made on the structure and circuit arrangement of the DRAM in order to enhance the refresh characteristics.

It is also a problem of the DRAM to heighten the threshold voltage $V_{th}$ of the memory cell selecting MIS transistor. It is disclosed in the official gazette of Japanese Patent Application Laid-open No. 214155/1990, No. 58556/1992 or No. 36318/1997 that, as a practicable expedient for solving this problem, polycrystalline silicon whose conductivity type is the p-type is employed for the gate electrode of a MIS transistor of n-channel type.

SUMMARY OF THE INVENTION

A MIS transistor for selecting a memory cell is a switching element, which is interposed between a capacitor and a bit line, and which serves to electrically connect and disconnect them. It includes a pair of semiconductor regions for a source and a drain which are formed in a semiconductor substrate, and a gate electrode which is formed on the semiconductor substrate through a gate insulating film.

An active region, in which the memory cell selecting MIS transistor is formed, is defined by an element isolation region. LOCOS (Local Oxidation of Silicon) is usually applied to the element isolation region for the reasons of easy formation, etc.

However, an impurity region for preventing inversion is required at the boundary between the LOCOS region and the semiconductor substrate. More specifically, the impurity region, which has the same conductivity type as that of the semiconductor substrate and which has a high impurity concentration, is formed in the part of the semiconductor substrate underlying the LOCOS region.

As a consequence, an electric field intensified at the junction between the impurity region and the semiconductor region of the storage node of the memory cell selecting MIS transistor, resulting on the problem that the refresh characteristics of the memory cell are deteriorated.

Besides, in a logic/memory hybrid type DRAM, a DRAM circuit and a logic circuit are unified to facilitate the producing process. By way of example, the gate insulating films of the memory cell selecting MIS transistors of the DRAM circuit and those of the MIS transistors of the logic circuit are formed at the same time. Since, however, a high voltage is required in boosting the potential of a word line, the gate insulating film cannot be made very thin in the memory cell selecting MIS transistor from the viewpoint of ensuring reliability. In consequence, the gate insulating film of the MIS transistor of the logic circuit must be thickened in agreement with the gate insulating film of the memory cell selecting MIS transistor. This results in the further problem that, in the MIS transistor of the logic circuit, the gate insulating film becomes unnecessarily thick, thereby to hamper enhancements in various capabilities, such as the driving current.

An object of the present invention is to provide a technique which can enhance refresh characteristics in a semiconductor integrated circuit device having a logic/memory hybrid type memory.

Another object of the present invention is to provide a technique which can enhance the driving capability of each MIS transistor of a logic circuit in a semiconductor integrated circuit device having a logic/memory hybrid type memory.

The above and other objects and novel features of the present invention will become apparent from the description provided in this specification when read in conjunction with the accompanying drawings.

Typical aspects of performance of the present invention are briefly summarized as follows:

A semiconductor integrated circuit device according to the present invention comprises a semiconductor integrated circuit device having a memory cell in which a MIS transistor and a capacitance element are connected in series, on a semiconductor substrate, wherein said MIS transistor includes a gate electrode in which polycrystalline silicon is disposed in contact with a gate insulating film, the conductivity type of said polycrystalline silicon is opposite to that of the semiconductor region for the source and drain regions of said MIS transistor, and an element isolation region for defining an active region of a semiconductor substrate, in which said MIS transistor is formed, is formed by burying an insulating film in an isolation groove which is formed in said semiconductor substrate.

Besides, a semiconductor integrated circuit device according to the present invention is characterized in that a logic circuit is formed around said memory cell, and that the conductivity type of a gate electrode of a MIS transistor, which constitutes said logic circuit, is identical to that of the semiconductor regions for a source and a drain of the logic-circuit constituting the MIS transistor.

Further, a semiconductor integrated circuit device according to the present invention is characterized in that the thickness of the gate insulating film of said MIS transistor of said memory cell is relatively greater than that of a gate insulating film of a MIS transistor which constitutes said logic circuit.

On the other hand, a method of producing a semiconductor integrated circuit device according to the present invention is characterized in that a memory cell in which a MIS transistor and a capacitance element are connected in series is formed on a semiconductor substrate, the method comprising the steps of:

(a) forming an isolation groove in a principal surface of the semiconductor substrate, and thereafter burying an insulating film in said isolation groove, thereby to form an isolation region;

(b) forming a gate insulating film on the resultant semiconductor substrate;

(c) depositing a polycrystalline silicon film on said gate insulating film; and (d) introducing an impurity into a gate electrode forming region for the MIS transistor within said polycrystalline silicon film, said impurity having a conductivity type opposite to that of the semiconductor regions for a source and a drain of said MIS transistor, wherein at the step of introducing said impurity into said gate electrode forming region within said polycrystalline silicon film, said impurity is simultaneously introduced into a gate electrode forming region for a MIS transistor other than the memory cell selecting MIS transistor, within said polycrystalline silicon film.

BRIEF DESCRIPTION OF THE DRAWINGS

FIGS. 2 thru 44 are sectional views respectively showing the essential portions of steps in a process for producing the semiconductor integrated circuit device illustrated in FIG. 1.

DETAILED DESCRIPTION OF THE PREFERRED EMBODIMENTS

Now, embodiments of the present invention will be described in detail in conjunction with the drawings. Throughout the drawings for describing the embodiments, the same symbols are assigned to portions having the same functions, which shall be omitted from repeated explanation.

Figure 1:
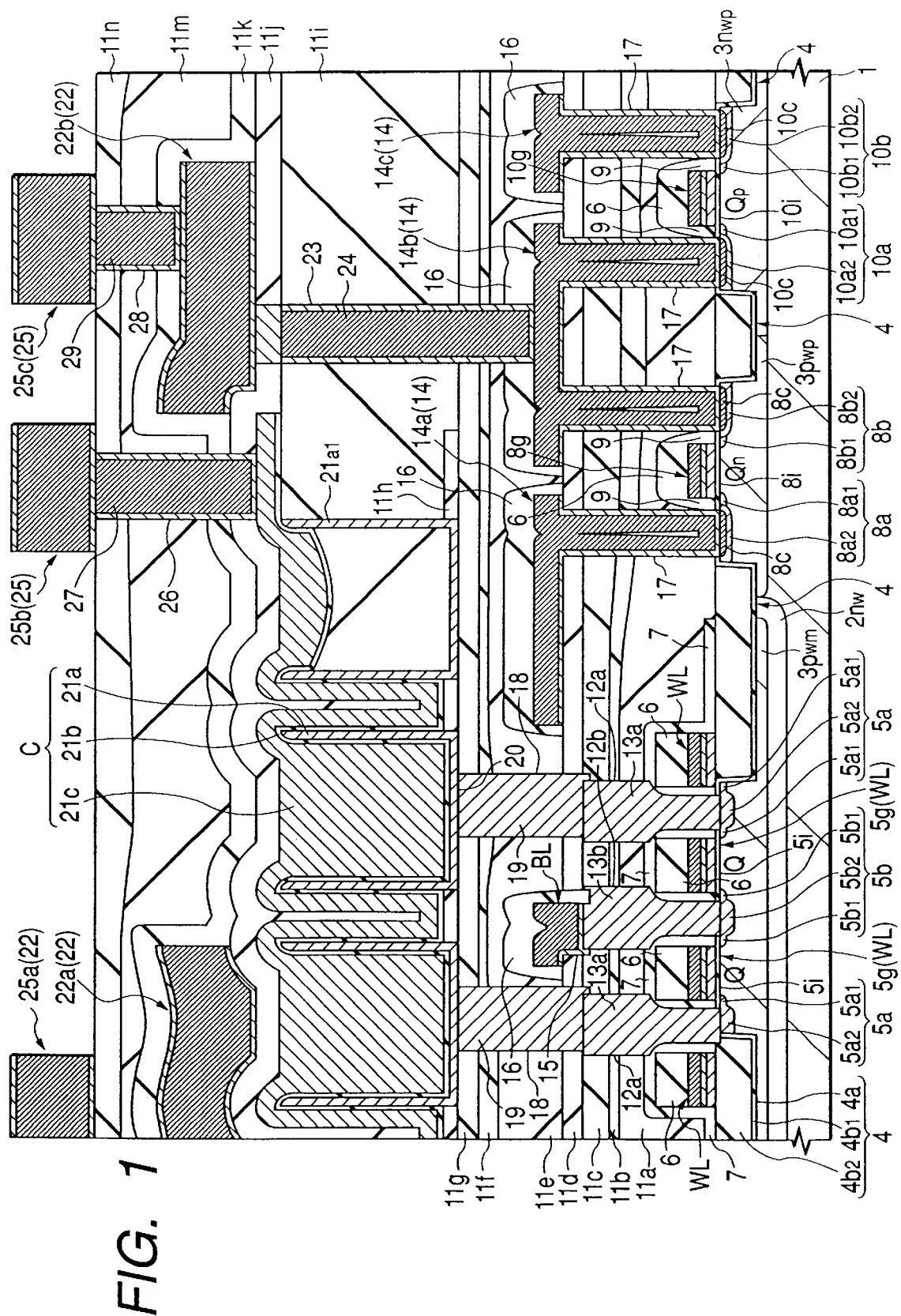
FIG. 1 is a sectional view showing the essential portions of a semiconductor integrated circuit device representing an embodiment of the present invention.
Figure 44:
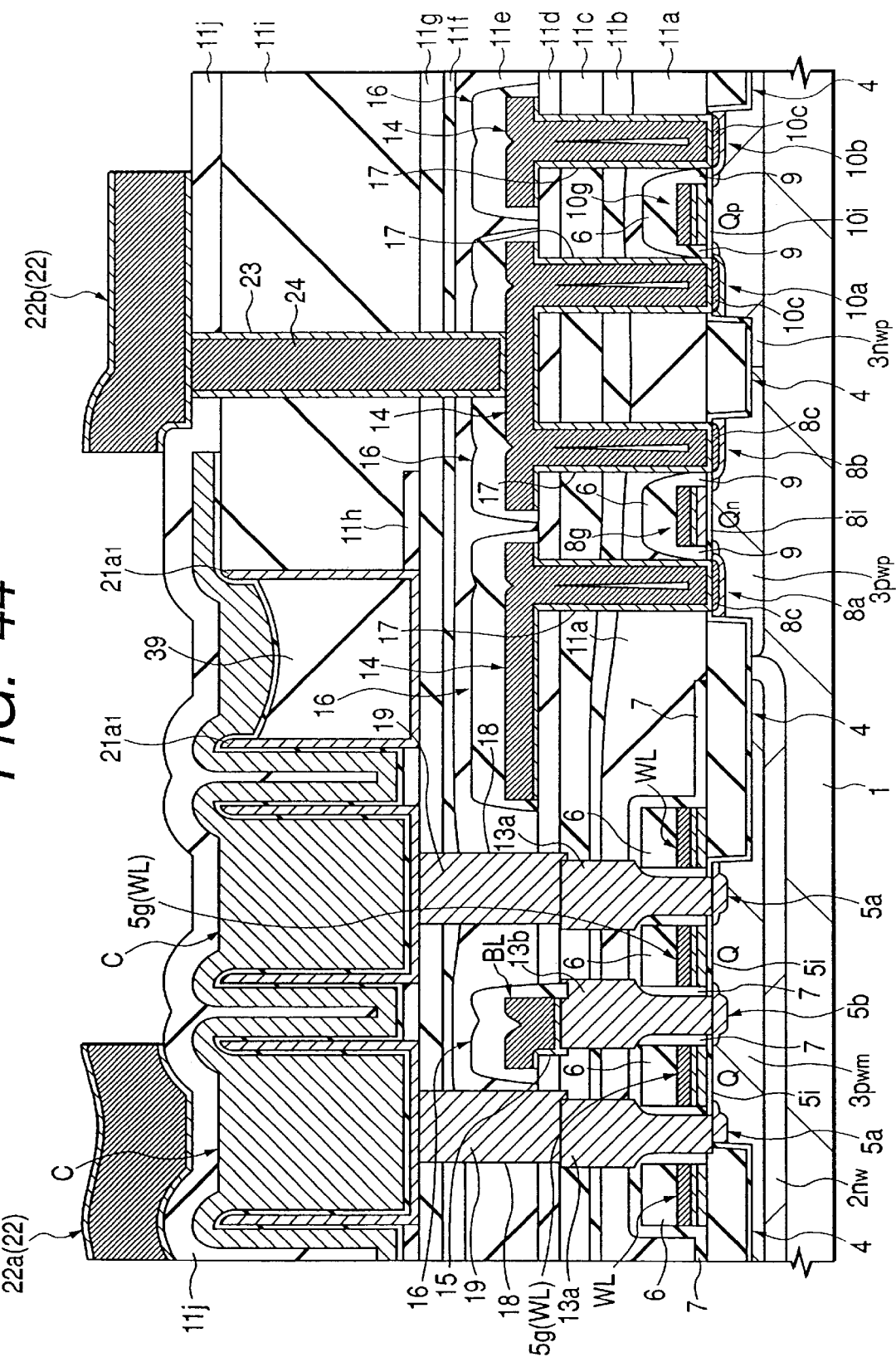
Figure 45A:
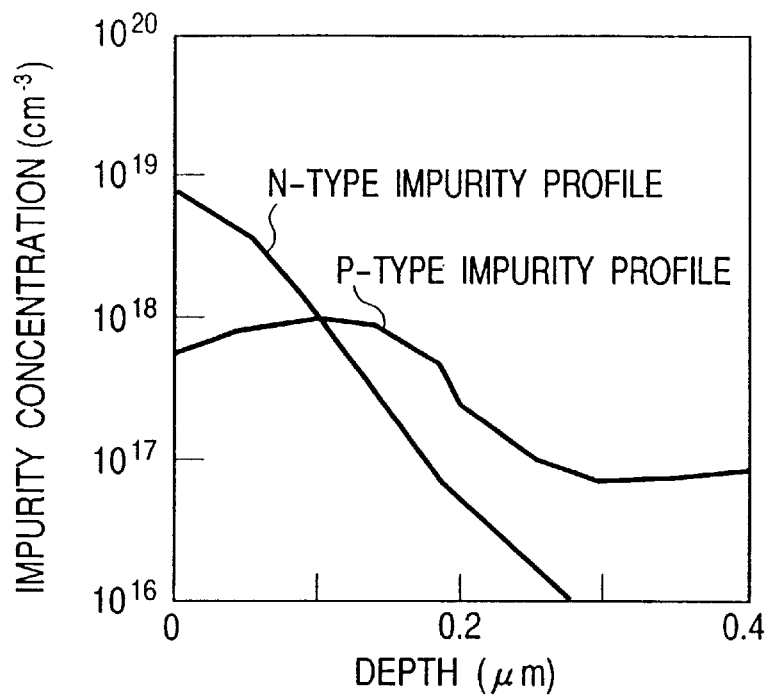
FIGS. 45(a) and 45(b) are graphs each showing an impurity concentration profile in a depthwise direction at the interface between an element isolation region and the semiconductor region of the storage node of a memory cell selecting MIS transistor of the n-channel type, wherein FIG. 45(a) corresponds to the memory cell selecting MIS transistor of a n$^+$ gate, while FIG. 45(b) corresponds to the memory cell selecting MIS transistor of a p$^+$ gate.
Figure 45B:
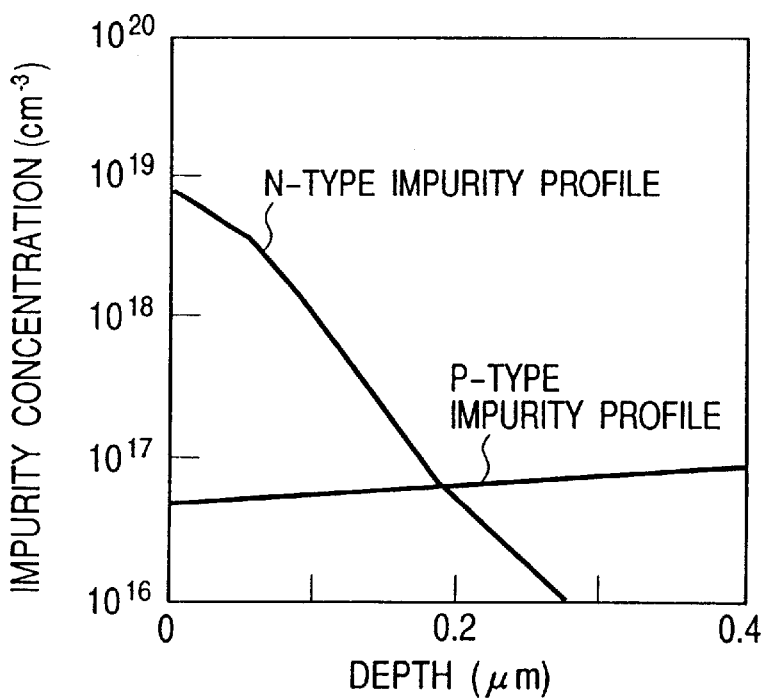

FIG. 1 is a sectional view showing the essential portions of a semiconductor integrated circuit device representing an embodiment of the present invention, FIGS. 2–44 are sectional views showing the essential portions of steps in a process for producing the semiconductor integrated circuit device illustrated in FIG. 1, and FIGS. 45(a) and 45(b) are graphs each showing an impurity concentration profile in a depthwise direction at the interface between the semiconductor region of a storage node and an element isolation region, wherein FIG. 45(a) corresponds to an n-channel type MIS.FET (Field Effect Transistor) of n$^+$ gate, while FIG. 45(b) corresponds to an n-channel type MIS.FET of p$^+$ gate.

First, a sectional structure in the DRAM of this embodiment will be described with reference to FIG. 1. A semiconductor substrate 1 is made of, for example, silicon single crystal of p$^-$-type, and a deep n-well $2nw$ is formed in the memory circuit domain (hereinbelow, termed "memory domain") thereof. The deep n-well $2nw$ is doped with, for example, phosphorus (P) being, which is an n-type impurity.

A p-well $3pw_m$ is formed in the upper part of the deep n-well $2nw$. The p-well $3pw_m$ is surrounded with the deep n-well $2nw$, thereby to be electrically isolated from a logic circuit domain (hereinbelow, termed "logic domain") etc. This p-well $3pw_m$ is doped with, for example, boron (B), which is a p-type impurity. The concentration of the p-type impurity is on the order of, for example, $10^{17} \sim 10^{18}$ [/cm$^3$].

Besides, in the part of the semiconductor substrate 1 corresponding to the logic domain, etc., a p-well $3pw_p$ is formed having a depth which is substantially equal to that of the p-well $3pw_m$ of the memory domain. The p-well $3pw_p$ is doped with, for example, boron (B) as a p-type impurity. The concentration of the p-type impurity is on the order of, for example, $10^{17} \sim 10^{18}$ [/cm$^3$].

Further, in the part of the semiconductor substrate 1 corresponding to the logic domain, etc., an n-well $3nw_p$ is formed having a depth which is substantially equal to that of the p-well $3pw_m$ of the memory domain. The n-well $3nw_p$ is doped with, for example, phosphorus (P) or arsenic (As) as an n-type impurity. The concentration of the n-type impurity is on the order of, for example, $10^{17} \sim 10^{18}$ [/cm$^3$].

An element isolation region 4 of shallow grooving/burying type is formed in the upper part of the semiconductor substrate 1. More specifically, the element isolation region 4 is formed in such a way that insulating films $4b_1$ and $4b_2$ for isolation are buried in an isolation groove $4a$ which is dug in the thickness direction of the semiconductor substrate 1 and which is 0.3~0.4 [$\mu$m] deep.

The insulating films $4b_1$ and $4b_2$ for isolation are made of, for example, silicon dioxide (SiO$_2$), etc. Incidentally, the upper surface of the element isolation region 4 is flattened so that its height may substantially agree with the height of the principal surface of the semiconductor substrate 1.

Owing to the element isolation region 4 of the shallow grooving/burying type, effects to be stated below by way of example can be attained.

The region 4 has the groove $4a$, which is 0.3~0.4 [$\mu$m] deep, and the conductivity type of the part of the semiconductor substrate 1 underlying the insulating films $4b_1$ and $4b_2$ for isolation is difficult of inversion, so that an impurity region for preventing an inversion need not be formed in the part of the semiconductor substrate 1 underlying the element isolation region 4. Accordingly, the impurity concentration of a p-n junction, which is defined at the interface between the element isolation region 4 and the impurity region of the storage node of a memory cell selecting MIS.FET to be explained below, lowers, and the electric field of the junction can be weakened.

The memory cells of the DRAM are formed on the p-well $3pw_m$ in the memory domain (left side as viewed in FIG. 1) of the semiconductor substrate 1. Each of the memory cells includes one MIS.FET Q for selecting the memory cell, and one capacitor (capacitance element for storing information) C.

The memory cell selecting MIS.FET Q includes a pair of semiconductor regions $5a$ and $5b$ which are respectively formed in the upper parts of the p-well $3pw_m$ so as to be spaced from each other, a gate insulating film $5i$ which is formed on the semiconductor substrate 1, and a gate electrode $5g$ which is formed on the gate insulating film $5i$. By the way, the threshold voltage of the memory cell selecting MIS.FET Q is, for example, about 1 [V].

The semiconductor regions $5a$ and $5b$ are regions for forming the source and drain of the memory cell selecting MIS.FET Q, and they are doped with, for example, arsenic (As), which is an n-type impurity. The channel region of the memory cell selecting MIS.FET Q is formed directly underlying the gate electrode 5g between the semiconductor regions 5a and 5b.

In addition, the gate electrode 5g is formed by part of a word line WL, and a poly-metal structure is constructed by depositing, for example, a low-resistance polysilicon film, a titanium nitride (TiN) film and a tungsten (W) film in this order from below. A poly-metal serving as the low-resistance material of the gate electrode 5g exhibits a sheet resistance which is as low as about 2 Ω/□. It is therefore utilizable not only as the gate electrode material, but also as a wiring line material.

The low-resistance polysilicon film of the gate electrode 5g is doped with, for example, boron (B), which is a p-type impurity. Thus, effects to be stated below by way of example can be attained.

Even when the impurity concentration of the semiconductor substrate 1 (that is, the impurity concentration of the p-well $3pw_m$, also termed the "substrate concentration" hereinbelow) is not especially raised, the threshold voltage of the memory cell selecting MIS.FET Q is permitted to increase. Therefore, the channel region directly underlying the gate electrode 5g need not be doped with any impurity for adjusting the threshold voltage, and the substrate concentration can be lowered.

In more detail, the work function of the $p^+$-type polysilicon is about 5.15 [V], which is approximately 1 [V] greater relative to the work function, 4.15 [V] of $n^+$-type polysilicon. Even for the same substrate concentration, therefore, the n-channel type memory cell selecting MIS.FET Q which employs the gate electrode 5g of $p^+$-type polysilicon can have its threshold voltage set approximately 1 [V] higher than an n-channel type memory cell selecting MIS.FET which employs a gate electrode of the $n^+$-type polysilicon.

Owing to the lowering of the substrate concentration, an electric field in the vicinity of the junction of the semiconductor region 5a to which the capacitor C is connected can be moderated, so that a leakage current to flow between the storage node and the semiconductor substrate 1 can be reduced. Moreover, the subthreshold current of the memory cell selecting MIS.FET Q can be reduced by the lowering of the substrate concentration, so that the leakage current of the MIS.FET can be reduced even for the same threshold voltage. Owing to the reduction of the leakage current, it is permitted to enhance the refresh characteristics of the memory cell.

The gate insulating film 5i is made of, for example, silicon dioxide ($SiO_2$), and its thickness is set at, for example, about 6~12 [nm], preferably about 8 [nm].

The gate electrode 5g, namely, the word line WL of such a memory cell selecting MIS.FET Q is overlaid with a cap insulating film 6 made of, for example, silicon nitride ($Si_3N_4$) through an insulating film made of, for example, silicon dioxide ($SiO_2$). Incidentally, the insulating film which underlies the cap insulating film 6 serves to relax a stress exerted from this cap insulating film 6.

Besides, an insulating film 7 made of, for example, silicon nitride ($Si_3N_4$) is formed on the front surface (upper surface) of the cap insulating film 6, the side surfaces of the gate electrode 5g (word line WL), and that part of the principal surface of the semiconductor substrate 1 which lies between the word lines WL adjacent to each other.

On the other hand, a MIS.FET Qn of n-channel type is formed on the p-well $3pw_p$ in the logic domain (right side as viewed in FIG. 1). The n-channel type MIS.FET Qn includes a pair of semiconductor regions 8a and 8b, which are respectively formed in the upper parts of the p-well $3pw_p$ so as to be spaced from each other, a gate insulating film 8i, which is formed on the semiconductor substrate 1, and a gate electrode 8g, which is formed on the gate insulating film 8i. By the way, the threshold voltage of the MIS.FET Qn is, for example, about 0.1 [V].

The semiconductor regions 8a and 8b are regions for forming the source and drain of the n-channel type MIS.FET Qn, and the channel region of the n-channel type MIS.FET Qn is formed directly underlying the gate electrode 8g between the semiconductor regions 8a and 8b.

The semiconductor regions 8a and 8b are of LDD (Lightly Doped Drain) structure. More specifically, the semiconductor regions 8a and 8b include low concentration regions $8a_1$, $8b_1$ and high concentration regions $8a_2$, $8b_2$. The low concentration regions $8a_1$, $8b_1$ are formed on the sides of the channel region, and the high concentration regions $8a_2$, $8b_2$ are arranged outside the corresponding low concentration regions $8a_1$, $8b_1$.

The low concentration regions $8a_1$, $8b_1$ are doped with, for example, arsenic (As), which is an n-type impurity. The high concentration regions $8a_2$, $8b_2$ are similarly doped with, for example, arsenic (As), which is an n-type impurity, but their impurity concentration is set higher than the impurity concentration of the low concentration regions $8a_1$, $8b_1$. Incidentally, the semiconductor regions 8a and 8b are overlaid with silicide layers 8c which are made of, for example, titanium silicide ($TiSi_x$).

Besides, the gate electrode 8g is such that a low-resistance polysilicon film, a titanium nitride (TiN) film and a tungsten (W) film, for example, are deposited in this order from below. The low-resistance polysilicon film of the gate electrode 8g is doped with, for example, phosphorus (P) or arsenic (As), which is an n-type impurity. The metal films of the tungsten (W) film etc. which constitute the gate electrode 8g have the function of lowering the sheet resistance of the gate electrode 8g down to about 2~2.5 Ω/□. Thus, it is permitted to heighten the operating speed of the DRAM.

The gate insulating film 8i is made of, for example, silicon dioxide ($SiO_2$), and its thickness is set at, for example, about 6~12 [nm], preferably about 8 [nm], similar to the thickness of the gate insulating film 5i of the memory cell selecting MIS.FET Q. Alternatively, the gate insulating film 8i is set at a thickness of, for example, about 4 [nm] and may well be thinner than the gate insulating film 5i of the memory cell selecting MIS.FET Q. The thinner film 8i permits the operating speed of the n-channel type MIS.FET Qn to increase.

The gate electrode 8g is overlaid with a cap insulating film 6 made of, for example, silicon nitride ($Si_3N_4$) through an insulating film made of, for example, silicon dioxide ($SiO_2$). Incidentally, the insulating film which underlies the cap insulating film 6 serves to relax a stress exerted from this cap insulating film 6.

In addition, side walls 9 made of, for example, silicon nitride ($Si_3N_4$) are formed on the side surfaces of the cap insulating film 6 and the gate electrode 8g. Incidentally, the side walls 9 are chiefly employed as a mask for ion implantation in the case of forming the low concentration regions $8a_1$, $8b_1$ and the high concentration regions $8a_2$, $8b_2$ on the semiconductor substrate 1.

Also, a MIS.FET Qp of p-channel type is formed on the n-well $3nw_p$ in the logic domain. The p-channel type MIS.FET Qp includes a pair of semiconductor regions 10a and 10b which are respectively formed in the upper parts of the n-well $3nw_p$ so as to be spaced from each other, a gate insulating film 10*i* which is formed on the semiconductor substrate 1, and a gate electrode 10*g* which is formed on the gate insulating film 10*i*. By the way, the threshold voltage of the MIS.FET Qp is, for example, about 0.1 [V].

The semiconductor regions 10*a* and 10*b* are regions for forming the source and drain of the p-channel type MIS.FET Qp, and the channel region of the p-channel type MIS.FET Qp is formed directly underlying the gate electrode 10*g* between the semiconductor regions 10*a* and 10*b*.

The semiconductor regions 10*a* and 10*b* are of LDD (Lightly Doped Drain) structure. More specifically, the semiconductor regions 10*a* and 10*b* include low concentration regions $10a_1$, $10b_1$ and high concentration regions $10a_2$, $10b_2$. The low concentration regions $10a_1$, $10b_1$ are formed on the sides of the channel region, and the high concentration regions $10a_2$, $10b_2$ are arranged outside the corresponding low concentration regions $10a_1$, $10b_1$.

The low concentration regions $10a_1$, $10b_1$ are doped with, for example, boron (B), which is a p-type impurity. The high concentration regions $10a_2$, $10b_2$ are similarly doped with, for example, boron (B), which is a p-type impurity, but their impurity concentration is set higher than the impurity concentration of the low concentration regions $10a_1$, $10b_1$. Incidentally, the semiconductor regions 10*a* and 10*b* are overlaid with silicide layers 10*c* which are made of, for example, titanium silicide ($TiSi_x$).

The gate electrode 10*g* is so formed that a low-resistance polysilicon film, a titanium nitride (TiN) film and a tungsten (W) film, for example, are deposited in this order from below.

The low-resistance polysilicon film of the gate electrode 10*g* is doped with, for example, boron (B), which is a p-type impurity. Thus, the threshold voltage of the p-channel type MIS.FET Qp can be lowered to cope with a low voltage operation and the characteristics and operating reliability thereof are enhanced. Besides, the metal films of the tungsten (W) film etc. which constitute the gate electrode 10*g* have the function of lowering the sheet resistance of the gate electrode 10*g* down to about 2~2.5 $\Omega/\square$. Thus, it is possible to increase the operating speed of the DRAM.

The gate insulating film 10*i* is made of, for example, silicon dioxide ($SiO_2$), and its thickness is set at, for example, about 6~12 [nm], preferably about 8 [nm], similar to the thickness of the gate insulating film 5*i* of the memory cell selecting MIS.FET Q. Alternatively, the gate insulating film 10*i* is set at a thickness of, for example, about 4 [nm] and may well be thinner than the gate insulating film 5*i* of the memory cell selecting MIS.FET Q. The thinner film 10*i* allows the operating speed of the p-channel type MIS.FET Qp to be increased.

The gate electrode 10*g* is overlaid with a cap insulating film 6 made of, for example, silicon nitride ($Si_3N_4$) through an insulating film made of, for example, silicon dioxide ($SiO_2$). Incidentally, the insulating film which underlies the cap insulating film 6 serves to relax the stress exerted from this cap insulating film 6.

In addition, side walls 9 made of, for example, silicon nitride ($Si_3N_4$) are formed on the side surfaces of the cap insulating film 6 and the gate electrode 10*g*. Incidentally, the side walls 9 are chiefly employed as a mask for ion implantation in the case of forming the low concentration regions $10a_1$, $10b_1$ and the high concentration regions $10a_2$, $10b_2$ on the semiconductor substrate 1.

Such n-channel type MIS.FETs Qn and p-channel type MIS.FETs Qp form the logic circuits of the DRAM, such as a sense amplifier circuit, a column decoder circuit, a column driver circuit, a row decoder circuit, a row driver circuit, an I/O selector circuit, a data input buffer circuit, a data output buffer circuit and a power source circuit.

The semiconductor integrated circuit elements of the memory cell selecting MIS.FET Q, the p-channel type MIS.FET Qp, the n-channel type MIS.FET Qn, etc. as described above, are covered with interlayer insulating films 11*a*~11*c* which are deposited over the semiconductor substrate 1.

The interlayer insulating films 11*a*~11*c* are made of, for example, silicon dioxide ($SiO_2$). Of them, the interlayer insulating film 11*a* is deposited by, for example, SOG (Spin On Glass). Besides, the interlayer insulating films 11*b* and 11*c* are deposited by, for example, plasma CVD.

The upper surface of the interlayer insulating film 11*c* is flattened so that the height may substantially agree in the memory domain and the logic domain.

The interlayer insulating films 11*a* ~11*c* and the insulating film 7 in the memory domain are provided with contact holes 12*a* and 12*b* by which the semiconductor regions 5*a* and 5*b* are respectively denuded. At the lower parts of the contact holes 12*a* and 12*b*, the widthwise dimension of each gate electrode 5*g* (word line WL) is defined by those parts of the insulating film 7 which lie on the side surfaces of the gate electrodes 5*g* (word lines WL) adjacent to each other. That is, the contact holes 12*a* and 12*b* are provided in self-alignment fashion by the parts of the insulating film 7 lying on the side surfaces of the gate electrodes 5*g* (word lines WL).

Thus, even when the relative planar positions between the pattern of the contact holes 12*a*, 12*b* and the active regions of the memory cell selecting MIS.FETs Q have somewhat misregistered in an exposure process for transferring the pattern of the contact holes 12*a*, 12*b*, the gate electrodes 5*g* (word lines WL) are not partially exposed through these contact holes 12*a*, 12*b*.

Plugs 13*a* and 13*b* are respectively buried in the contact holes 12*a* and 12*b*. The plugs 13*a* and 13*b* are made of, for example, low-resistance polysilicon which contains phosphorus (P), which is an n-type impurity, and they are electrically connected with the semiconductor regions 5*a* and 5*b* of the memory cell selecting MIS.FETs Q, respectively. Incidentally, the plug 13*b* is overlaid with a silicide film which is made of, for example, titanium silicide ($TiSi_x$).

An interlayer insulating film 11*d* is deposited on the interlayer insulating film 11*c*. The interlayer insulating film 11*d* is made of, for example, silicon dioxide ($SiO_2$) and is formed by, for example, plasma CVD. This interlayer insulating film 11*d* is overlaid with a bit line BL and first-layer wiring lines 14 (14*a*~14*c*).

The bit line BL is so formed that a titanium (Ti) film, a titanium nitride (TiN) film and a tungsten (W) film, for example, are deposited in this order from below. This bit line BL is electrically connected with the plug 13*b* through a contact hole 15 provided in the interlayer insulating film 11*d*, and further with the semiconductor region 5*b* of the memory cell selecting MIS.FET Q through the plug 13*b*. The surface (upper surface and side surfaces) of the bit line BL is covered with an insulating film 16 which is made of, for example, silicon nitride ($Si_3N_4$).

By the way, the bit line BL extends in a direction which intersects the extending direction of the word lines WL. Accordingly, the bit line BL is usually unshown in a section as depicted in FIG. 1, but it is shown here for the purposes of illustrating the wiring layer in which the bit line BL is arranged, of explaining later the function of the insulating film 16 which covers the surface of the bit line BL, and so forth.

Similar to the bit line BL, each of the first-layer wiring lines 14 in the logic domain is so formed that a titanium (Ti) film, a titanium nitride (TiN) film and a tungsten (W) film, for example, are deposited in this order from below. The surface (upper surface and side surfaces) of each first-layer wiring line 14 is covered with an insulating film 16 which is made of, for example, silicon nitride ($Si_3N_4$).

Of the first-layer wiring lines 14, the first one 14a is electrically connected with the semiconductor region 8a of the n-channel type MIS.FET Qn through a contact hole 17 which is provided in the interlayer insulating films 11a~11d. Besides, the first-layer wiring line 14b is electrically connected with the semiconductor region 8b of the n-channel type MIS.FET Qn and the semiconductor region 10a of the p-channel type MIS.FET Qp through corresponding contact holes 17 which are provided in the interlayer insulating films 11a~11d. Further, the first-layer wiring line 14c is electrically connected with the semiconductor region 10b of the p-channel type MIS.FET Qp through a contact hole 17 which is provided in the interlayer insulating films 11a~11d.

Interlayer insulating films 11e~11g are deposited on the upper surface of the interlayer insulating film 11d in the order from below, thereby to cover the insulating film 16. The interlayer insulating films 11e~11g are made of, for example, silicon dioxide ($SiO_2$). Of them, the interlayer insulating film 11e is deposited by, for example, SOG (Spin On Glass). Besides, the interlayer insulating films 11f and 11g are formed by, for example, plasma CVD. The upper surface of the interlayer insulating film 11g is flattened so that its height may substantially agree in the memory domain and the logic domain.

The interlayer insulating films 11d~11g in the memory domain are provided with a contact hole 18 by which the upper surface of the plug 13a is denuded. In this embodiment, the surface of the bit line BL is covered with the insulating film 16 made of silicon nitride ($Si_3N_4$) or the like. Therefore, even when the contact hole 18 has come to overlap the bit line BL due to the deviation of its planar position in the widthwise direction of this bit line BL, the insulating film 16 made of silicon nitride ($Si_3N_4$) or the like functions as an etching stopper. It is therefore possible to prevent the bit line BL from being directly exposed through the contact hole 18.

A plug 19 is buried in the contact hole 18. The plug 19 is made of, for example, low-resistance polysilicon which contains phosphorus (P), which is an n-type impurity. This plug 19 is electrically connected with the plug 13a, through which it is electrically connected with the semiconductor region 5a of the memory cell selecting MIS.FET Q.

Interlayer insulating films 11h and 11i are deposited on the upper surface of the interlayer insulating film 11g. The interlayer insulating film 11h is made of, for example, silicon nitride ($Si_3N_4$) and is formed so as to mainly cover the memory domain. The interlayer insulating film 11i is made of, for example, silicon dioxide ($SiO_2$). The interlayer insulating films 11h and 11i are provided with an opening 20 by which the upper surface of the plug 19 is denuded. The capacitor C of the memory cell is formed in the opening 20.

The capacitor C is formed in the shape of, for example, a crown. It includes a storage electrode 21a, a capacitance insulating film 21b which covers the surface of the storage electrode 21a, and a plate electrode 21c which covers the surface of the capacitance insulating film 21b.

The storage electrode 21a of the capacitor C is made of, for example, low-resistance polysilicon. The surface of the storage electrode 21a is formed with, for example, a plurality of minute rugged parts (roughened parts) in order that the capacitance of the capacitor C may be increased without enlarging the occupation area thereof.

The lower part of the storage electrode 21a is electrically connected with the plug 19 through the opening 20, and is electrically connected with the semiconductor region 5a of the memory cell selecting MIS.FET Q through the plug 19. Incidentally, a storage electrode 21a1 which is arranged in the boundary domain between the memory domain and the logic domain in FIG. 1 (substantially at the central part as viewed in FIG. 1) is a dummy.

In addition, the capacitance insulating film 21b of the capacitor C is made of, for example, tantalum pentoxide ($Ta_2O_5$). The plate electrode 21c of the capacitor C is made of, for example, titanium nitride (TiN) and is formed so as to cover a plurality of storage electrodes 21a as stated above.

An interlayer insulating film 11j is deposited on the interlayer insulating film 11i, thereby to cover the plate electrode 21c. The interlayer insulating film 11j is made of, for example, silicon dioxide ($SiO_2$) and is overlaid with second-layer wiring lines 22 (22a, 22b).

Each of the second-layer wiring lines 22 is so formed that a titanium nitride (TiN) film, an aluminum (Al) film and a titanium (Ti) film, for example, are deposited in this order from below. The second-layer wiring line 22b in the logic domain is electrically connected with the first-layer wiring line 14b through a conductor film 24 which is formed in a contact hole 23. The contact hole 23 is provided in the interlayer insulating films 11e~11g, 11i and 11j and the insulating film 16. The conductor film 24 is so formed that a titanium nitride (TiN) film and a tungsten (W) film, for example, are deposited in this order from below.

Interlayer insulating films 11k, 11m and 11n are deposited on the interlayer insulating film 11j in this order from below, thereby to cover the second-layer wiring lines 22. The interlayer insulating films 11k and 11n are made of, for example, silicon dioxide ($SiO_2$) and are formed by, for example, plasma CVD. The interlayer insulating film 11m is made of, for example, silicon dioxide ($SiO_2$) and is formed by, for example, SOG.

The interlayer insulating film 11n is overlaid with third-layer wiring lines 25 (25a~25c). Each of the third-layer wiring lines 25 is so formed that a titanium nitride (TiN) film, an aluminum (Al) film and a titanium (Ti) film, for example, are deposited in this order from below.

Of the third-layer wiring lines 25, the third-layer wiring line 25b in the logic domain is electrically connected with the plate electrode 21c through a conductor film 27 which is formed in a contact hole 26 provided in the interlayer insulating films 11j, 11k, 11m and 11n. Besides, the third-layer wiring line 25c in the logic domain is electrically connected with the second-layer wiring line 22b through a conductor film 29 which is formed in a contact hole 28 provided in the interlayer insulating films 11k, 11m and 11n. Each of the conductor films 27 and 29 is so formed that a titanium nitride (TiN) film and a tungsten (W) film, for example, are deposited in this order from below.

The third-layer wiring lines 25 are overlaid with a passivation film made of, for example, a dual-layer insulating film in which a silicon dioxide ($SiO_2$) film and a silicon nitride ($Si_3N_4$) film are stacked. However, such films are omitted from illustration in the drawings.

Next, an example of a method of producing the semiconductor integrated circuit device of the above embodiment will be described with reference to FIG. 2~FIG. 44.

First, as shown in FIG. 2, a semiconductor substrate 1 which is made of silicon (Si) single crystal of the p-type is heat-treated to form in its surface a pad film 30 which is made of, for example, silicon dioxide ($SiO_2$) being about 10~30 [nm] thick. Thereafter, an oxidation-proof film 31 which is made of, for example, silicon nitride ($Si_3N_4$) being about 100~200 [nm] thick is deposited on the pad film 30 by CVD (Chemical Vapor Deposition).

Subsequently, as shown in FIG. 3, those parts of the oxidation-proof film 31, pad film 30 and semiconductor substrate 1 which correspond to each element isolation region are successively etched using an etching mask which is photoresist 32a formed on the oxidation-proof film 31, whereby isolation grooves 4a each being about 350~400 [nm] deep are formed in the semiconductor substrate 1. On this occasion, the gas which is used for etching the oxidation-proof film 31 is, for example, $CF_4+CHF_3+Ar$ or $CF_4+Ar$, and the gas which is used for etching the semiconductor substrate 1 is, for example, $HBr+Cl_2+He+O_2$.

Thereafter, as shown in FIG. 4, in order to remove a damaged layer which has been developed on the inner wall of each isolation groove 4a by the etching, the resultant semiconductor substrate 1 is subjected to an oxidation treatment, whereby an insulating film $4b_1$ which is made of, for example, silicon dioxide ($SiO_2$) is formed on the inner surface of each isolation groove 4a. Further, as shown in FIG. 5, an insulating film $4b_2$ which is made of, for example, silicon dioxide ($SiO_2$) is deposited on the resultant semiconductor substrate 1 by CVD. On this occasion, the insulating film $4b_2$ is formed by, for example, plasma CVD employing TEOS (tetraethoxysilane) gas.

Figure 6:
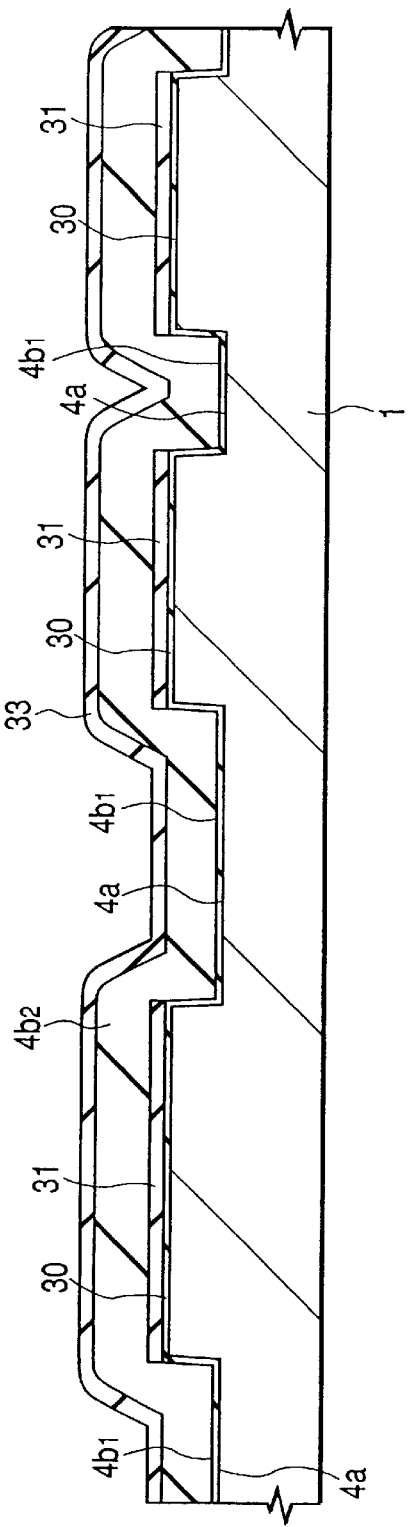
Figure 7:
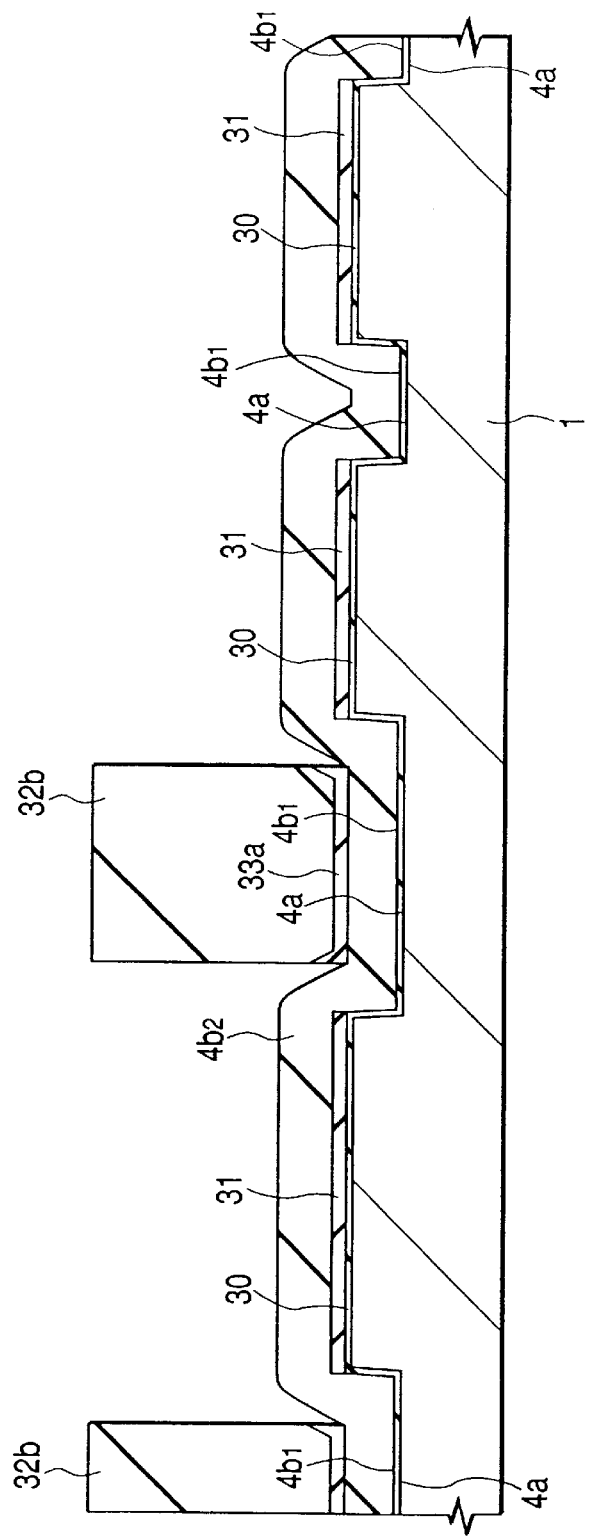

Subsequently, as shown in FIG. 6, an insulating film 33 which is made of, for example, silicon nitride ($Si_3N_4$) is deposited on the insulating film $4b_2$ by CVD or the like. Thereafter, as shown in FIG. 7, the insulating film 33 is etched using photoresist 32b as an etching mask, whereby the pattern of an insulating film 33a made of silicon nitride ($Si_3N_4$) or the like is formed on each of those parts of the element isolation region which is relatively broad in width (large in area).

The insulating film 33a of silicon nitride ($Si_3N_4$) or the like left on the element isolation region functions to prevent a phenomenon called "dishing". More specifically, in polishing and flattening the insulating film $4b_2$ by CMP (Chemical Mechanical Polishing) at the next step, undesirably the insulating film $4b_2$ in the isolation groove 4a having a relatively large area is polished deeper than the insulating film $4b_2$ in the isolation groove 4a of the element isolation region having a relatively small area. This phenomenon results in the dishing.

Subsequently, the insulating film $4b_2$ is polished so as to be left in the isolation grooves 4a by CMP employing the insulating films 31 and 33a as a stopper, thereby to form each element isolation region 4 as shown in FIG. 8. On this occasion, in this embodiment, the pattern of the insulating film 33a is disposed on the element isolation region 4 of relatively broad width (large area), so that the upper surface of the insulating film $4b_2$ for isolation can be prevented from scraping off in the element isolation region 4. It is therefore possible that the height (level) of the upper surface of the insulating film $4b_2$ for isolation in the element isolation region 4 is brought into substantial agreement with the height (level) of the principal surface of the semiconductor substrate 1.

At the next step, the oxidation-proof film 31 and the insulating film 33a are removed with hot phosphoric acid or the like, and the pad film 30 is removed. Further, the resultant semiconductor substrate 1 is subjected to a pre-oxidation treatment.

Subsequently, a photoresist pattern for forming a deep n-well by which a memory domain is denuded is formed on the semiconductor substrate 1. Phosphorus (P), which is an n-type impurity, for example, is ion-implanted into the memory domain of the semiconductor substrate 1 by employing the photoresist pattern as a mask.

Thereafter, the photoresist pattern for forming the deep n-well is removed, and a photoresist pattern by which p-well regions are denuded is formed on the semiconductor substrate 1. Boron (B), which is a p-type impurity, for example, is ion-implanted into the p-well forming regions of the semiconductor substrate 1 by employing the photoresist pattern as a mask.

Subsequently, the photoresist pattern for forming the p-wells is removed, and a photoresist pattern by which an n-well region is denuded is formed on the semiconductor substrate 1. Phosphorus (P), which is an n-type impurity, for example, is ion-implanted into the n-well forming region of the semiconductor substrate 1 by employing the photoresist pattern as a mask.

Next, the photoresist pattern for forming the n-well is removed, followed by the heat treatment of the resultant semiconductor substrate 1. Thus, as shown in FIG. 9, the deep n-well 2nw, the p-wells $3pw_m$ and $3pw_p$, and the n-well $3nw_p$ are formed in the semiconductor substrate 1.

The deep n-well 2nw functions to prevent noise from entering from an input/output circuit or the like into the p-well $3pw_m$ of the memory domain through the semiconductor substrate 1, thereby to prevent the loss of electric charges stored in a memory cell.

Thereafter, the resultant semiconductor substrate 1 is subjected to a thermal oxidation treatment or a wet oxidation treatment. Thus, gate insulating films 5i, 8i and 10i which are made of, for example, silicon dioxide ($SiO_2$) and each of which has a thickness of, for example, 6~12 [nm], preferably about 8 [nm], are formed on the principal surfaces of the active regions of the semiconductor substrate 1.

At the next step, as shown in FIG. 10, a polysilicon film 34 is deposited on the resultant semiconductor substrate 1 by CVD or the like.

Subsequently, the producing method shifts to impurity introducing steps for setting the conductivity types of the gate electrodes of MIS.FETs which are to be formed on the semiconductor substrate 1.

More specifically, as shown in FIG. 11, photoresist 32c by which an n-channel type MIS.FET forming region is denuded in a logic domain is formed on the polysilicon film 34. Phosphorus (P) or arsenic (As), which is an n-type impurity, for example, is ion-implanted into the polysilicon film 34 by employing the photoresist 32c as a mask.

Subsequently, the photoresist 32c is removed. Thereafter, as shown in FIG. 12, photoresist 32d is formed, by which a region for forming a memory cell selecting MIS.FET and a region for forming a p-channel type MIS.FET in the logic domain are denuded, and boron (B) or boron fluoride ($BF_2$), which is being a p-type impurity, for example, is ion-implanted into the polysilicon film 34 by employing the photoresist 32d as a mask.

In the ion implantation of the p-type impurity such as boron (B) or boron fluoride ($BF_2$), the implantation energy may well be controlled so as to prevent boron (B) or the like from arriving at a very deep position of the polysilicon film 34.

More specifically, if boron (B) or the like is introduced down to a deep position of the lower layer part of the polysilicon film 34, a phenomenon is likely to occur in which boron (B) or the like is diffused into the semiconductor substrate 1 through the gate insulating film 5i by a later thermal process. The above contrivance is effective to suppress the occurrence of such a phenomenon.

Subsequently, as shown in FIG. 13, a barrier metal film 35 made of, for example, titanium nitride (TiN) or tungsten nitride ($W_2N_3$), a metal film made of, for example, tungsten (W), and an insulating film 6 made of, for example, silicon nitride ($Si_3N_4$) are deposited on the polysilicon film 34 in this order from below.

Figure 14:
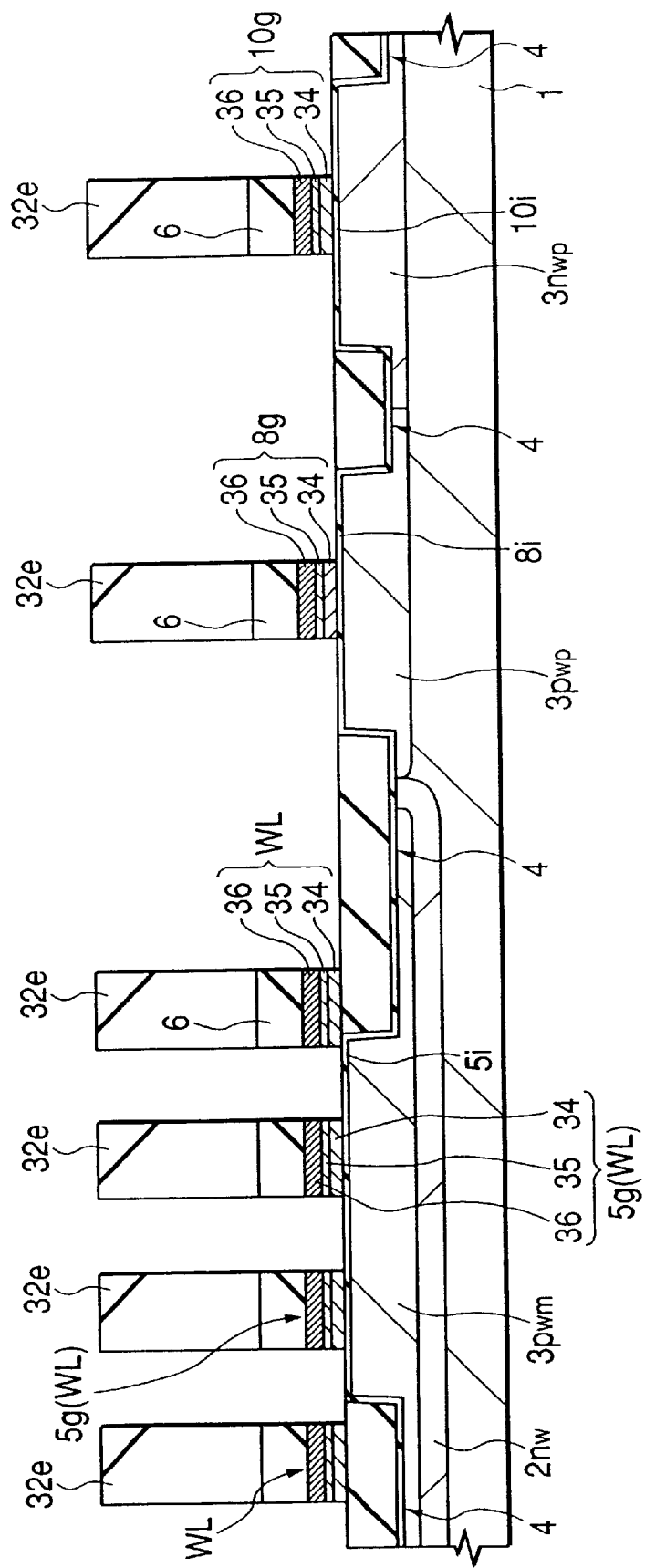
Figure 15:
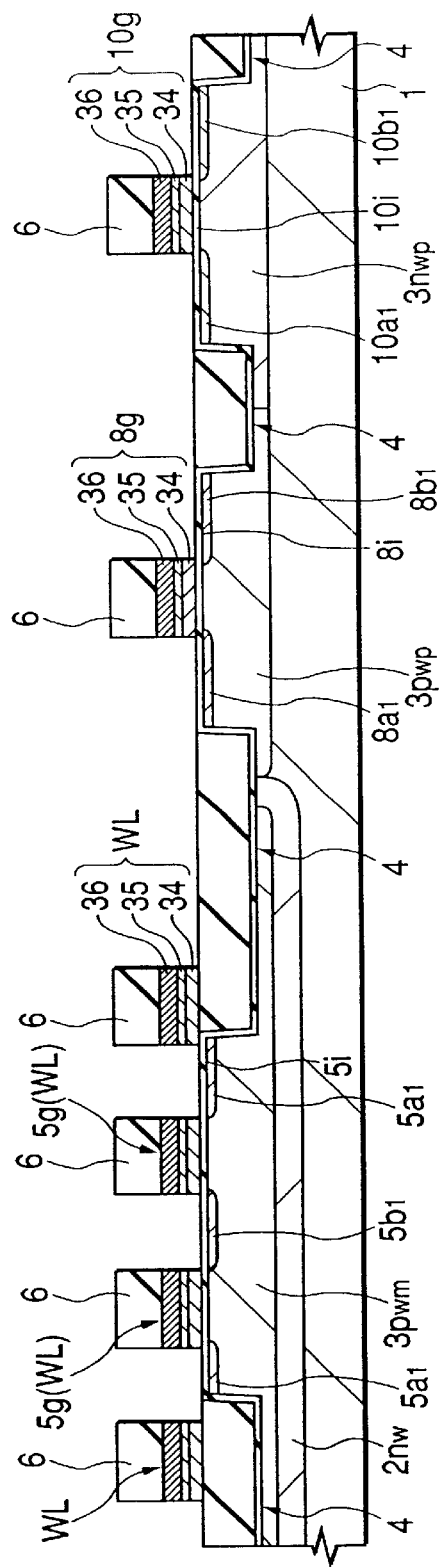

Next, as shown in FIG. 14, the resultant semiconductor substrate 1 is subjected to an etching process with an etching mask in the form of a gate electrode forming photoresist 32e deposited on the insulating film 6. Thus, gate electrodes 5g (namely, word lines WL), gate electrodes 8g and 10g, and cap insulating films 6 are patterned and formed.

The gate electrode 5g forms part of the memory cell selecting MIS.FET, and functions as the word line WL in a region other than the active region. The width of the gate electrode 5g (word line WL), in other words, the gate length of the MIS.FET, is set at a minimum dimension (for example, 0.24 [µm]) within allowable limits within which the threshold voltage of the memory cell selecting MIS.FET can be secured at a predetermined value or above by suppressing the short channel effect thereof. In addition, the interval between the adjacent two gate electrodes 5g (word lines WL) is set at the minimum dimension (for example, 0.22 [µm] which is determined by the resolution limit of photolithography. The gate electrodes 8g and 10g form parts of the n-channel type MIS.FET and p-channel type MIS.FET of a logic circuit, respectively.

At the next step, photoresist by which the n-channel type MIS.FETs (including the memory cell selecting MIS.FET) are denuded is formed on the resultant semiconductor substrate 1. Arsenic (As), which is an n-type impurity, for example, is ion-implanted into the semiconductor substrate 1 by employing the photoresist as a mask.

After the photoresist for the n-channel type MIS.FETs has been removed, photoresist by which the p-channel type MIS.FET is denuded is formed on the resultant semiconductor substrate 1. Boron (B), which is a p-type impurity, for example, is ion-implanted into the semiconductor substrate 1 by employing the photoresist as a mask. After the ion implantation, the resultant semiconductor substrate 1 is annealed at about 800 [° C.]. The impurity introducing steps stated above serve to form the low-concentration regions $5a_1$, $5b_1$, $8a_1$, $8b_1$, $10a_1$ and $10b_1$ shown in FIG. 15.

Figure 16:
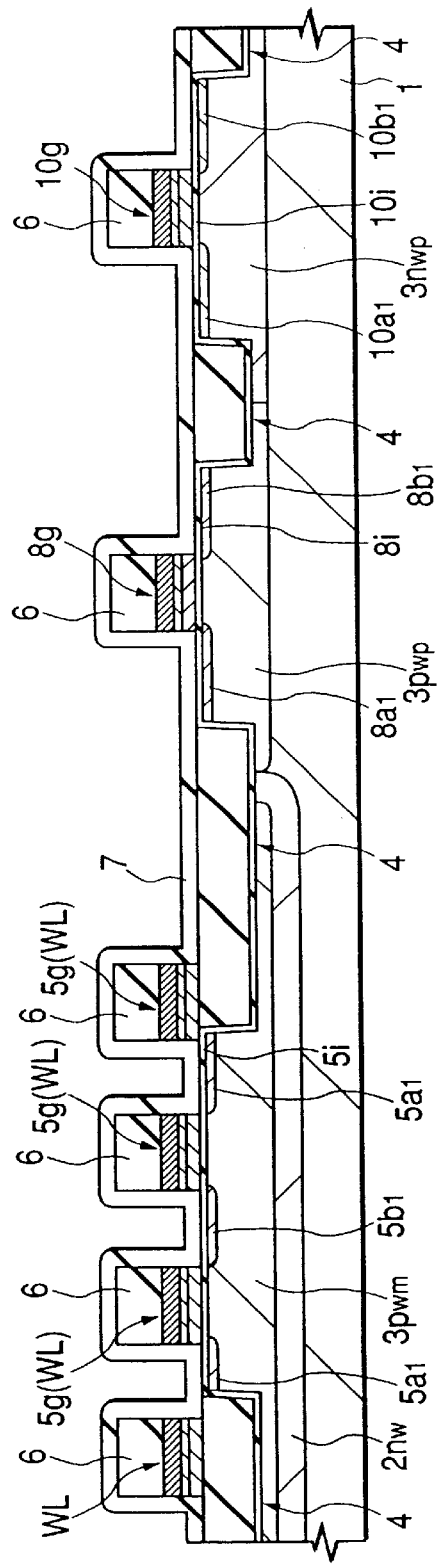
Figure 17:
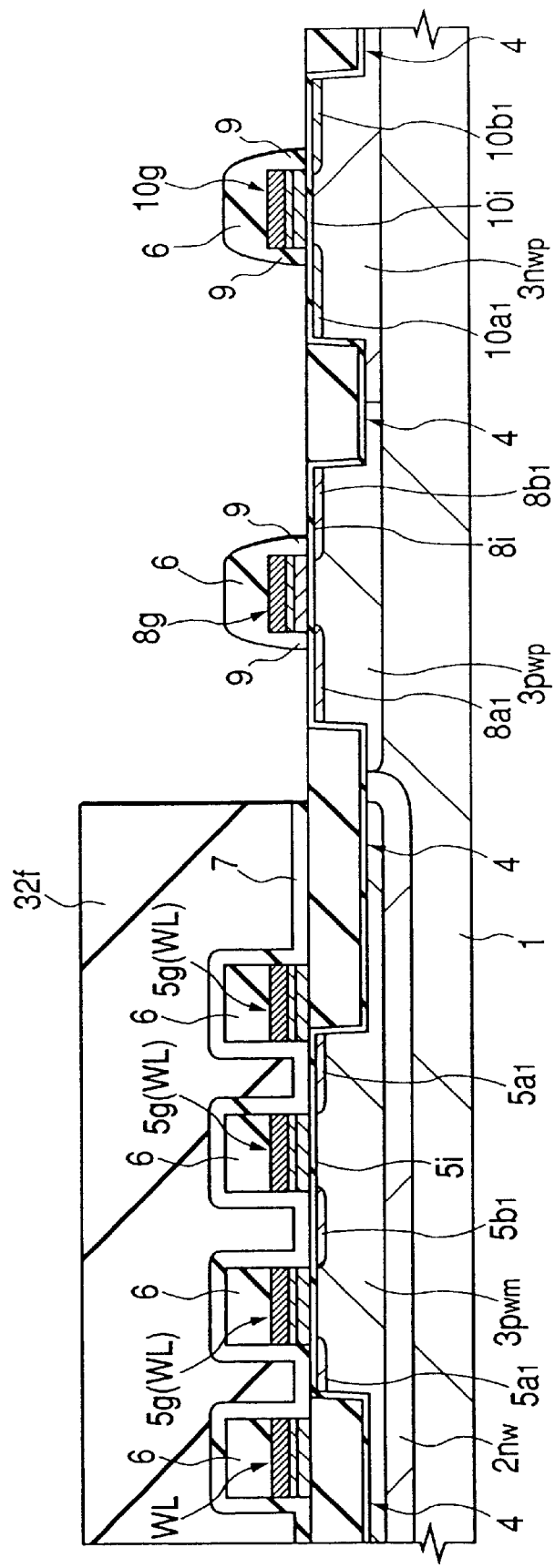

Subsequently, as shown in FIG. 16, an insulating film 7 made of, for example, silicon nitride ($Si_3N_4$) is deposited on the resultant semiconductor substrate 1 by CVD or the like. Further, as shown in FIG. 17, anisotropic dry etching is carried out with an etching mask in the form of photoresist 32f formed on the insulating film 7. Thus, the insulating film 7 is left in the memory domain, and side walls 9 made of silicon nitride ($Si_3N_4$) or the like are formed on the side surfaces of the gate electrodes 8g and 10g in the logic domain.

In order to minimize the quantities of scraping of the insulating films $4b_1$, $4b_2$ which are buried in the gate insulating films 5i, 8i, 10i and the element isolation region 4, the etching is carried out using an etching gas with which the etching rate of the silicon nitride film becomes greater than that of the silicon dioxide film. Besides, in order to minimize the quantity of scraping of the insulating film 6, which is a silicon nitride film or the like, overlying the gate electrodes 8g, 10g, the quantity of overetching is suppressed to the required minimum limit.

Subsequently, photoresist by which the n-channel type MIS.FET forming region is denuded in the logic domain is formed on the resultant semiconductor substrate 1. Further, arsenic (As), which is an n-type impurity, for example, is introduced by ion implantation or the like with a mask which is formed of the photoresist, the gate electrode 8g and the side walls 9.

Subsequently, photoresist by which the p-channel type MIS.FET forming region is denuded in the logic domain is formed on the resultant semiconductor substrate 1. Further, boron (B), which is a p-type impurity, for example, is introduced by ion implantation or the like with a mask which is formed of the photoresist, the gate electrode 10g and the side walls 9.

Figure 18:
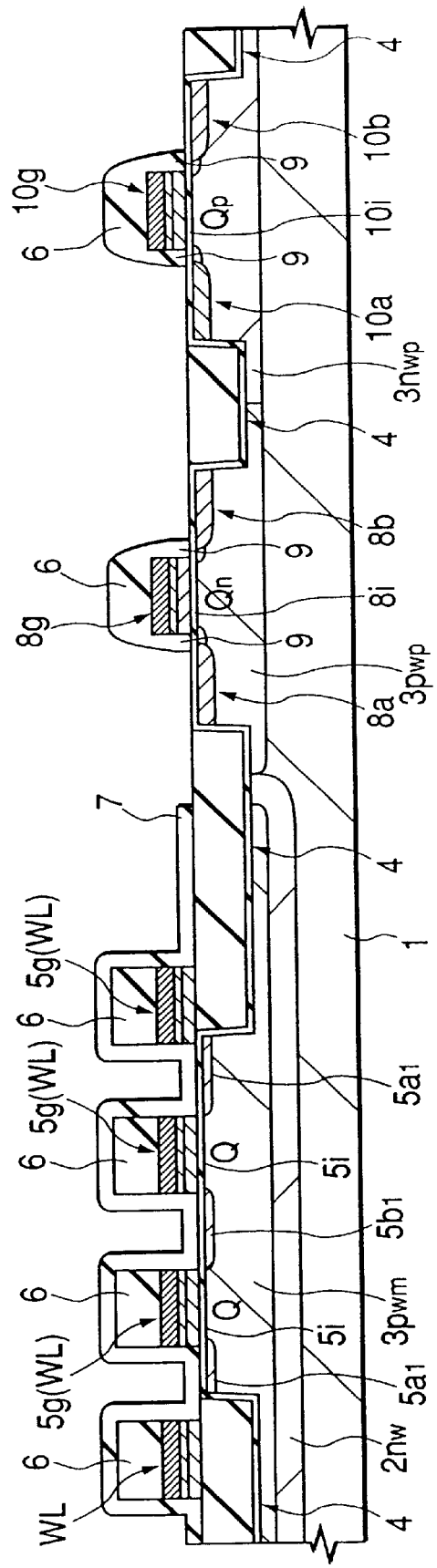

Thereafter, the resultant semiconductor substrate 1 is heat-treated in an atmosphere of, for example, nitrogen gas, whereby high-concentration regions $8a_2$, $8b_2$, $10a_2$ and $10b_2$ are formed in the logic domain of the semiconductor substrate 1. Thus, the MIS.FET Qn of n-channel type and the MIS.FET Qp of p-channel type for the logic circuit are formed as shown in FIG. 18.

Figure 19:
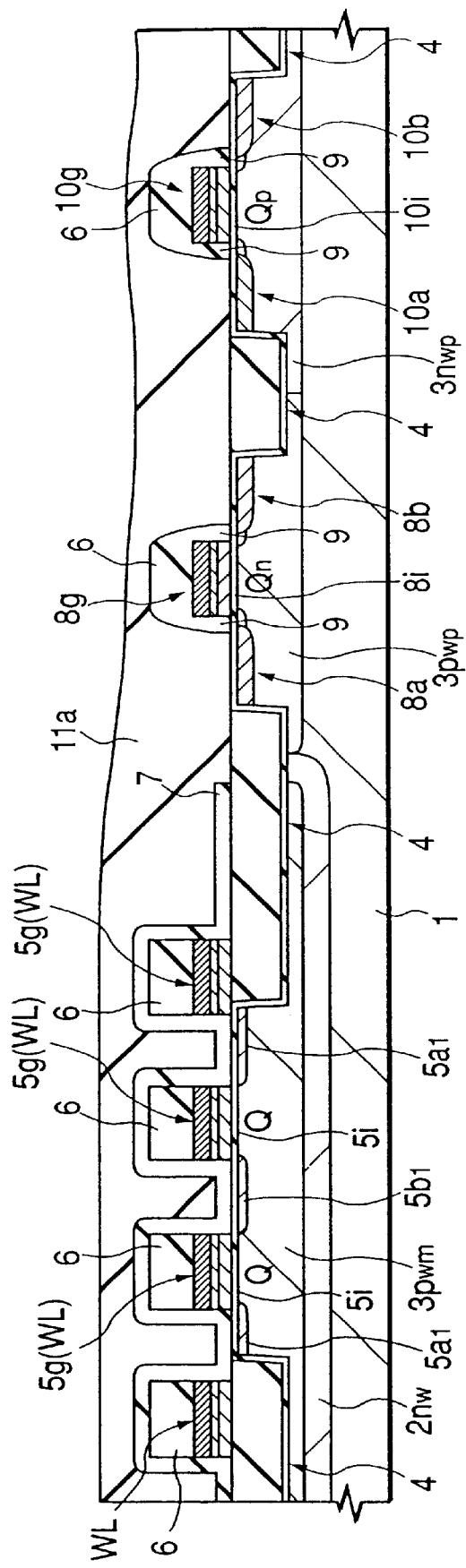

At the next step, as shown in FIG. 19, an interlayer insulating film 11a made of, for example, silicon dioxide ($SiO_2$) is deposited on the resultant semiconductor substrate 1 by SOG or the like.

Figure 20:
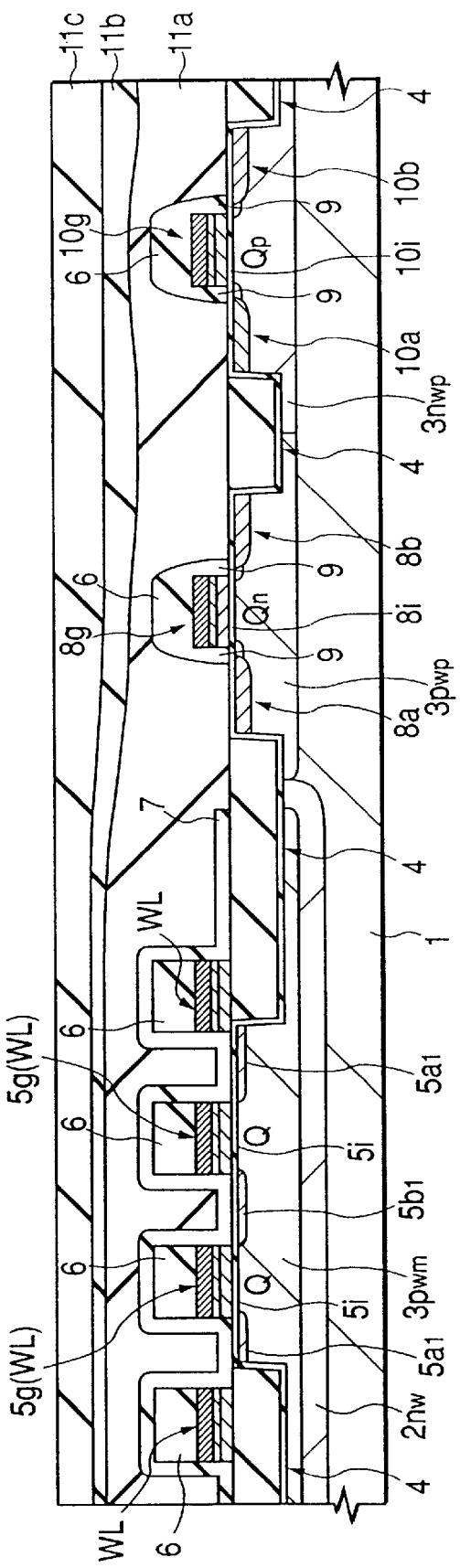

Subsequently, an insulating film made of silicon dioxide ($SiO_2$) or the like is deposited on the interlayer insulating film 11a by, for example, plasma CVD employing TEOS (tetraethoxysilane) gas. Thereafter, the upper part of the insulating film is etched back by CMP, whereby an interlayer insulating film 11b is formed on the interlayer insulating film 11a as shown in FIG. 20.

Thereafter, an interlayer insulating film 11c made of silicon dioxide ($SiO_2$) or the like is formed on the interlayer insulating film 11b by, for example, plasma CVD employing TEOS gas. The interlayer insulating film 11c functions to cover damage etc. which has occured at the upper part of the interlayer insulating film 11b during the CMP step. The upper surface of the interlayer insulating film 11c is flattened so that its height may substantially agree in the memory domain and the logic domain.

Figure 21:
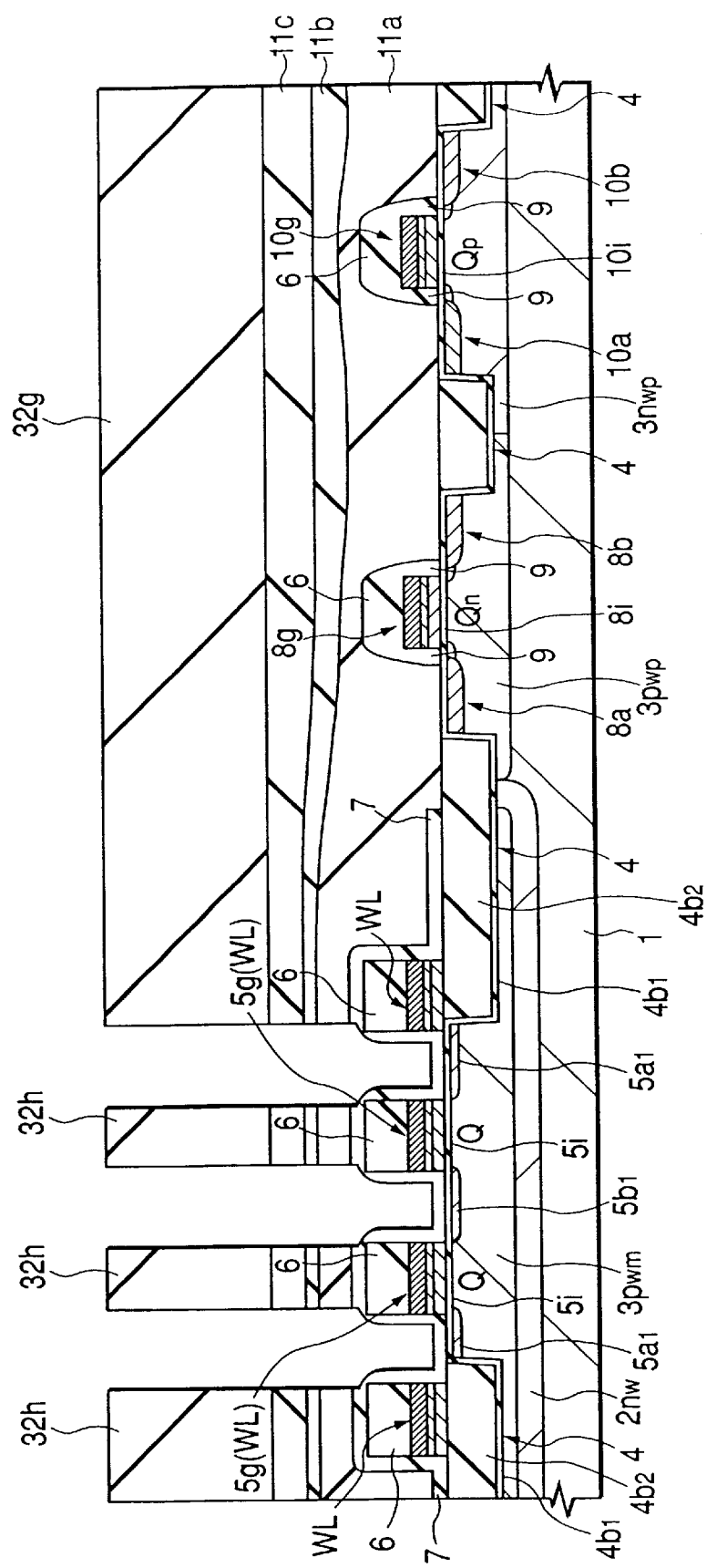

Subsequently, as shown in FIG. 21, photoresist 32g, by which contact holes for plugs are denuded, are formed on the interlayer insulating film 11c. On this occasion, since the upper surface of the interlayer insulating film 11c is flattened in this embodiment, a sufficient photolithographic margin can be secured, and a good pattern transfer is possible.

Thereafter, an etching process for providing the contact holes for the plugs is performed using the photoresist 32g as a mask. In this embodiment, the etching process is carried out as follows by way of example:

First, as shown in FIG. 21, conditions under which the silicon dioxide ($SiO_2$) is removed, but under which the silicon nitride ($Si_3N_4$) film is difficult to remove, are set in order that the etching may stop at the point of time at which the insulating film 7, the cap insulating film 6, etc. have appeared. A gaseous mixture, for example, $C_4F_8$/argon (Ar) gas is employed as an etching gas on this occasion.

Figure 22:
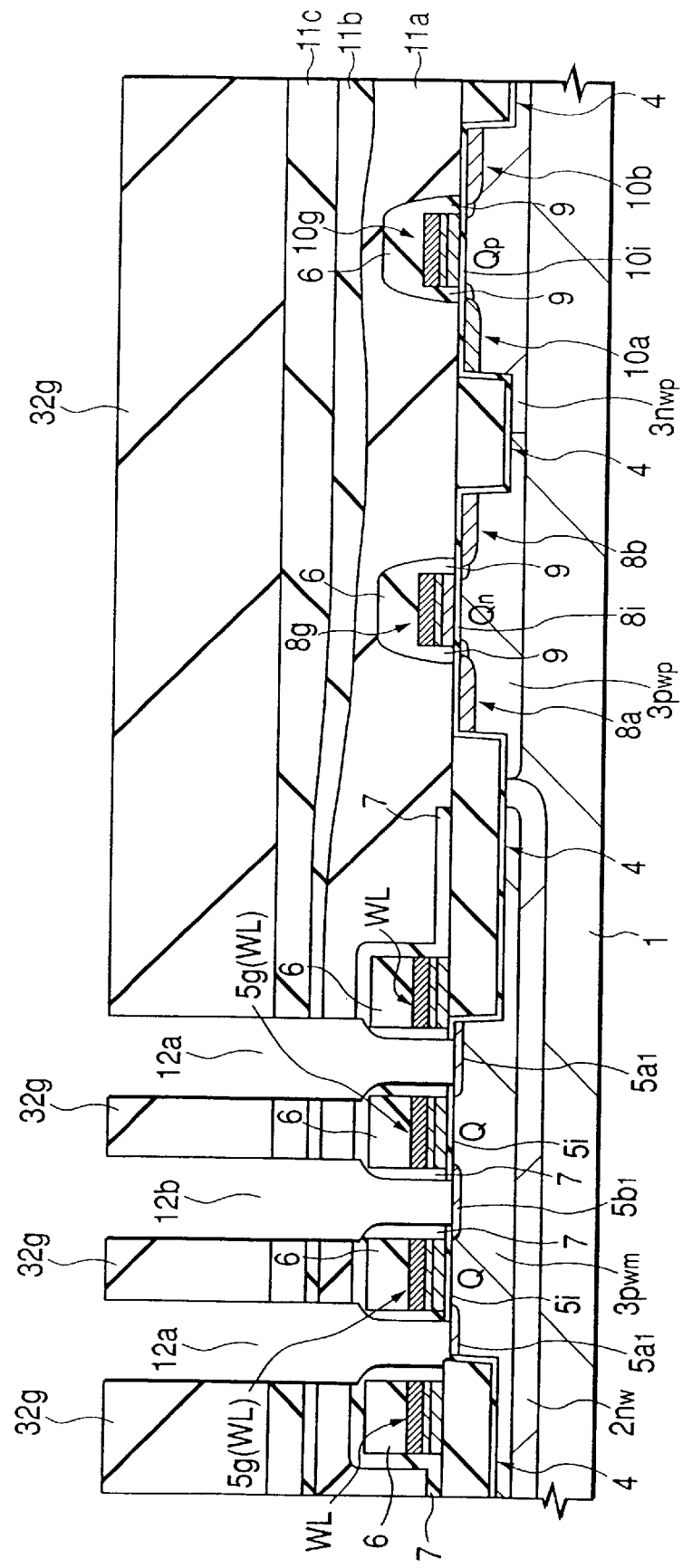

Subsequently, the etching conditions are changed into ones under which the silicon nitride ($Si_3N_4$) film is removed, but under which the silicon dioxide ($SiO_2$) is difficult to remove, whereby the contact holes 12a and 12b for the plugs, by which parts of the semiconductor substrate 1 are denuded, are provided as shown in FIG. 22. Thus, the contact holes 12a and 12b each having a microscopic diameter which is smaller than the resolution limit of photolithography can be formed. A gaseous mixture, for example, $CHF_3/Ar/CF_4$ is employed as an etching gas on this occasion.

The reason for performing such etching processes is as explained below. Otherwise, the insulating films $4b_1$, $4b_2$ for isolation in the element isolation regions 4, which are exposed through the contact holes 12a, 12b for the plugs, are etched and removed by the etching process for forming the contact holes 12a, 12b for the plugs, and a produced integrated circuit becomes defective.

After the photoresist 32g has been removed, phosphorus (P), which is an n-type impurity, for example, is ion-implanted into those parts of the semiconductor substrate 1 which are exposed through the contact holes 12a and 12b. The ion implantation is the impurity introducing step for relaxing an electric field.

Figure 23:
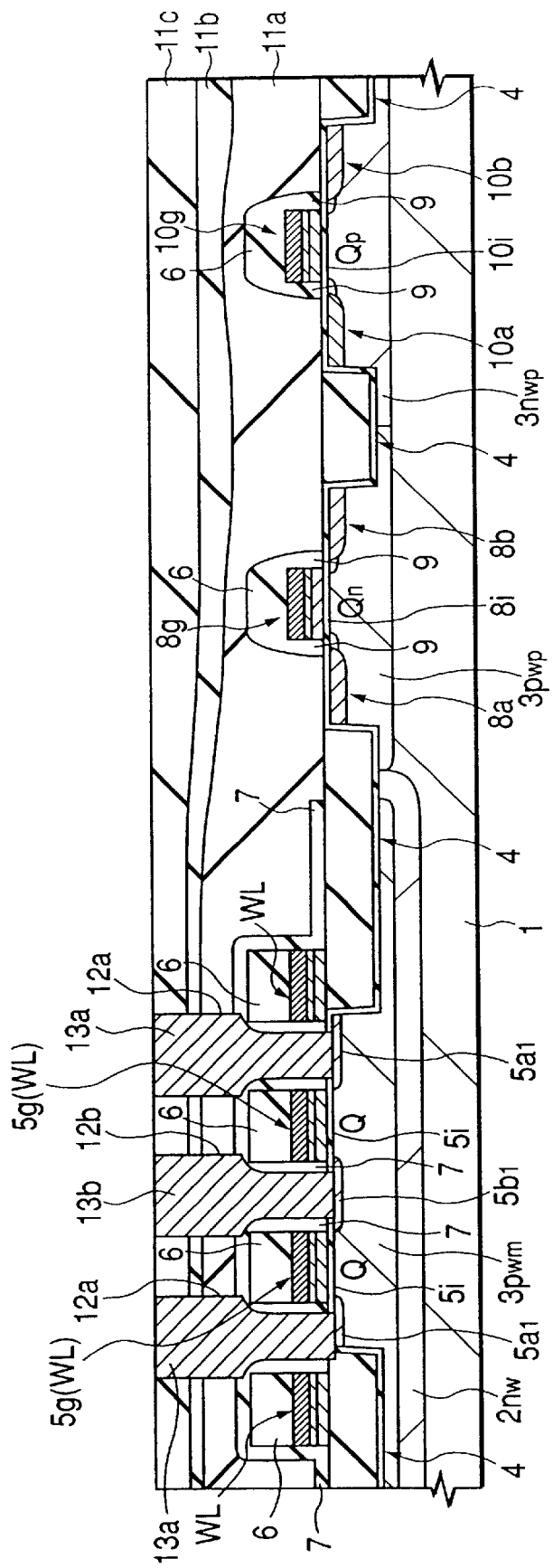

Next, low-resistance polysilicon containing an n-type impurity, for example, is deposited on the resultant semiconductor substrate 1 by CVD or the like, and then it is etched back. Thus, as shown in FIG. 23, the plugs 13a and 13b are respectively formed in the plug contact holes 12a and 12b.

Figure 24:
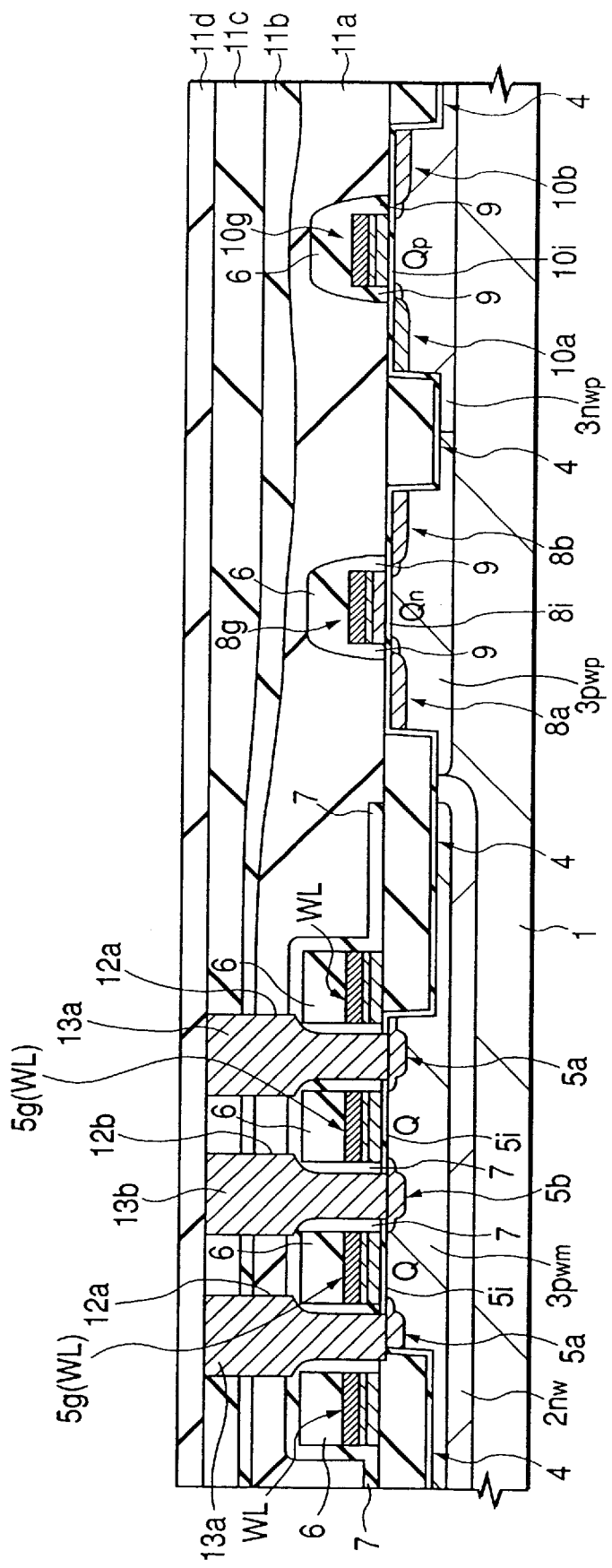

Subsequently, as shown in FIG. 24, an interlayer insulating film 11d made of, for example, silicon dioxide ($SiO_2$) is deposited on the resultant semiconductor substrate 1 by CVD or the like, thereby to cover the upper surfaces of the plugs 13a and 13b.

Incidentally, symbols $5a_2$ and $5b_2$ in FIG. 24 denote high-concentration regions which contain phosphorus (P) introduced by the above impurity introducing step for field relaxation. These high-concentration regions $5b_2$, $5b_1$ and the low-concentration regions $5a_1$, $5b_1$ constitute the semiconductor regions 5a, 5b of the memory cell selecting MIS.FET Q.

Figure 25:
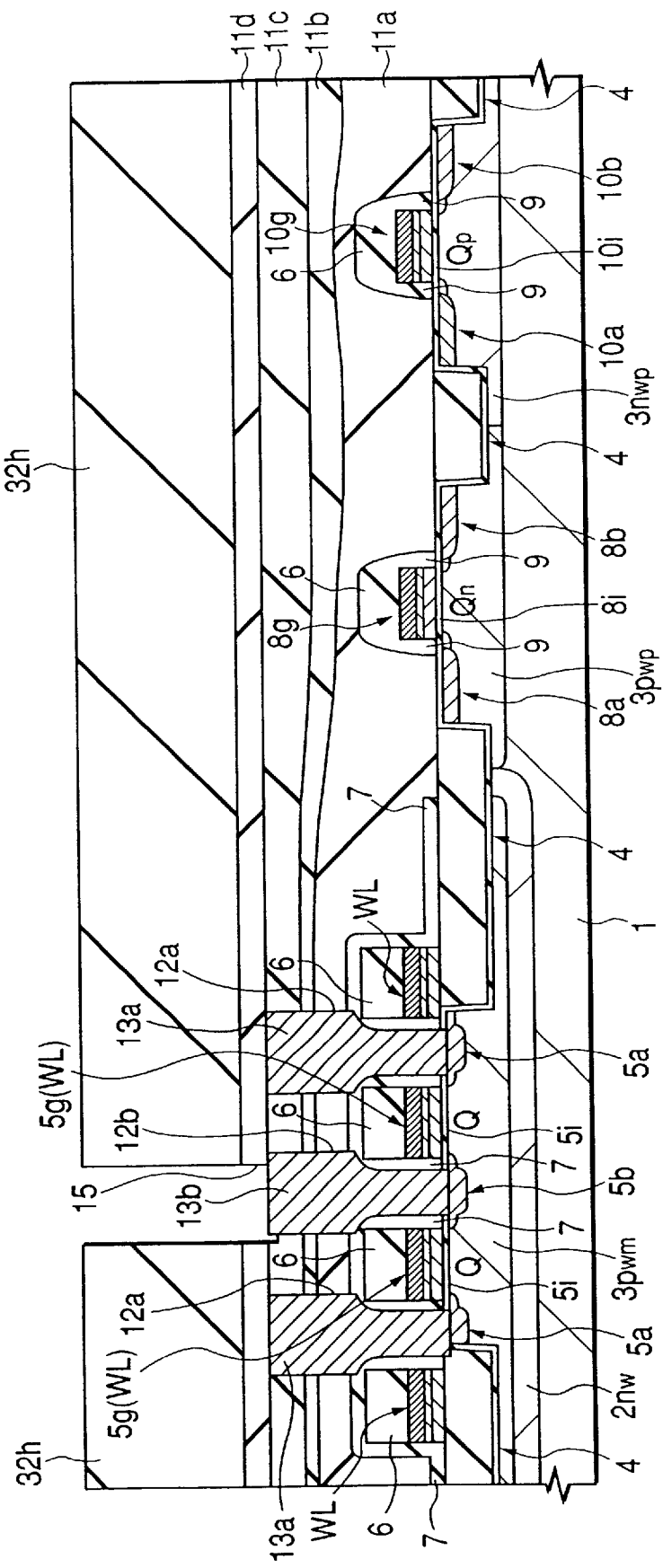

Thereafter, as shown in FIG. 25, photoresist 32h for forming a contact hole for a bit line is formed on the interlayer insulating film 11d. The contact hole 15 by which the upper surface of the plug 13b, is provided in the interlayer insulating film 11d with an etching mask, which is formed by the photoresist 32h.

Figure 26:
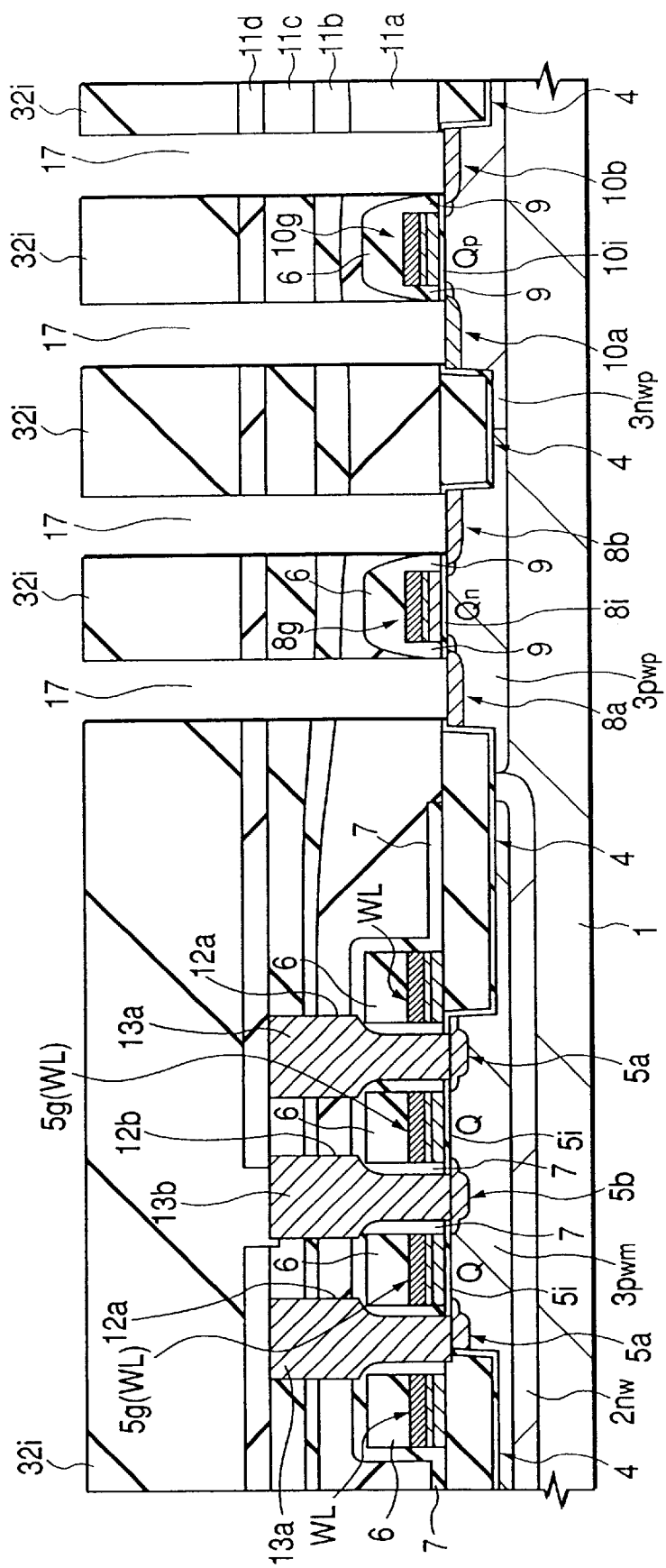

Subsequently, the photoresist 32h is removed. Thereafter, as shown in FIG. 26, photoresist 32i for forming contact holes for the logic circuit is formed on the interlayer insulating film 11d, and the contact holes 17 by which the upper surface of the semiconductor substrate 1 (semiconductor regions 8a, 8b, 10a, 10b) is denuded are provided in the interlayer insulating films 11a~11d with an etching mask, which is formed by the photoresist 32i.

Figure 27:
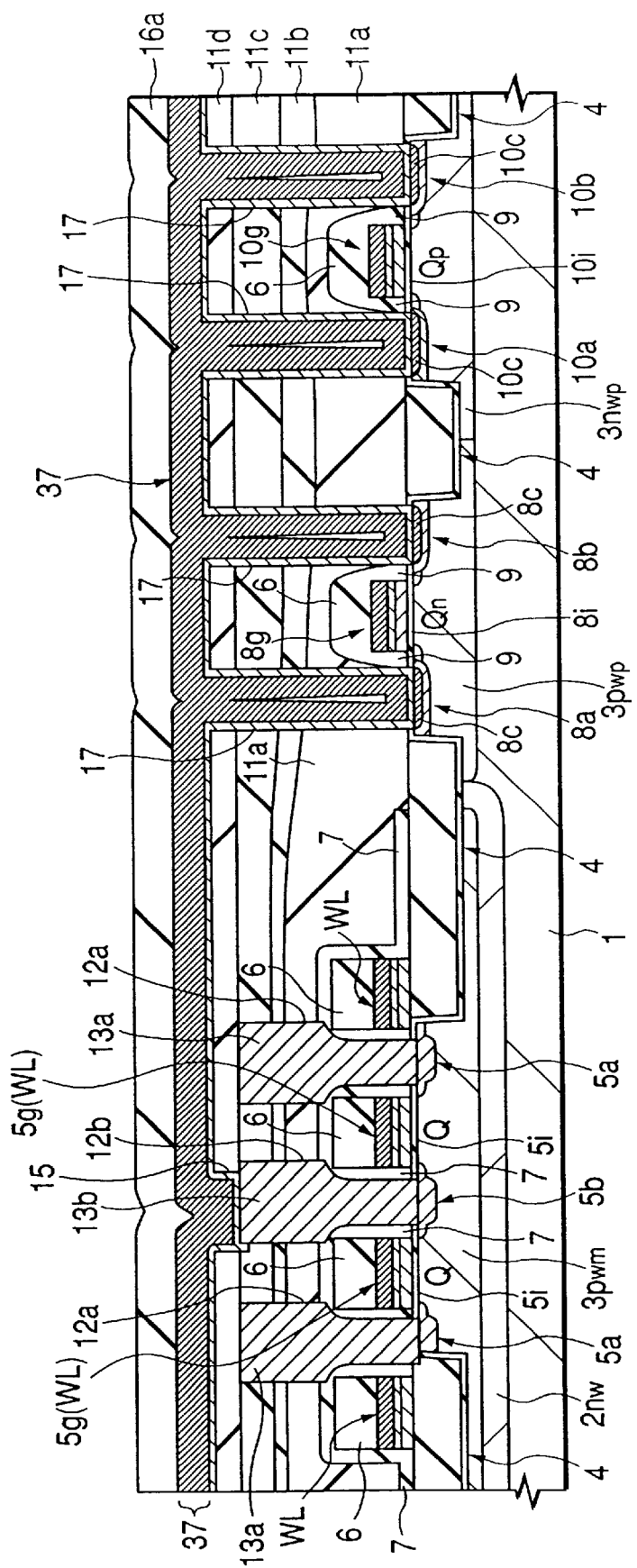

After the removal of the photoresist 32i, as shown in FIG. 27, a titanium (Ti) film and a titanium nitride (TiN) film, for example, are deposited on the resultant semiconductor substrate 1 by sputtering or the like in this order from below, and a tungsten (W) film, for example, is stacked on the sputtered films by CVD or the like, thereby to form a conductor film 37. Further, an insulating film 16a made of, for example, silicon nitride ($Si_3N_4$) is deposited on the conductor film 37 by CVD or the like.

Incidentally, symbols 8c and 10c in FIG. 27 denote silicide layers of $TiSi_x$ or the like which have been formed by, for example, the thermal treatment reaction between the semiconductor substrate 1 and the titanium (Ti) film, which forms the lower layer of the conductor film 37.

Figure 28:
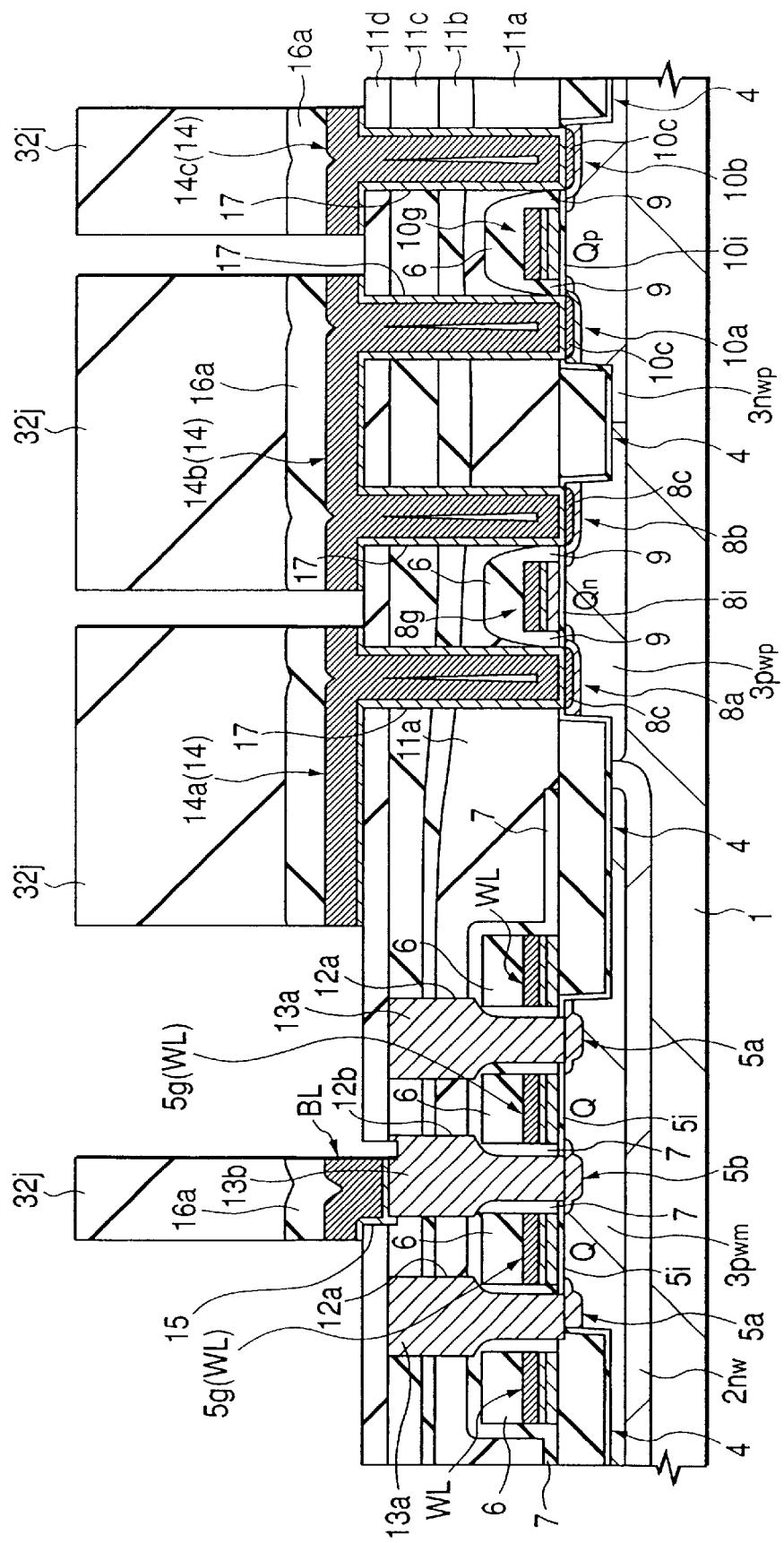

Thereafter, as shown in FIG. 28, photoresist 32j for forming wiring lines is formed on the insulating film 16a, and the insulating film 16a and the conductor film 37 are patterned by etching with the photoresist 32j employed as an etching mask. Thus, the bit line BL and the first-layer wiring lines 14 are formed.

Figure 29:
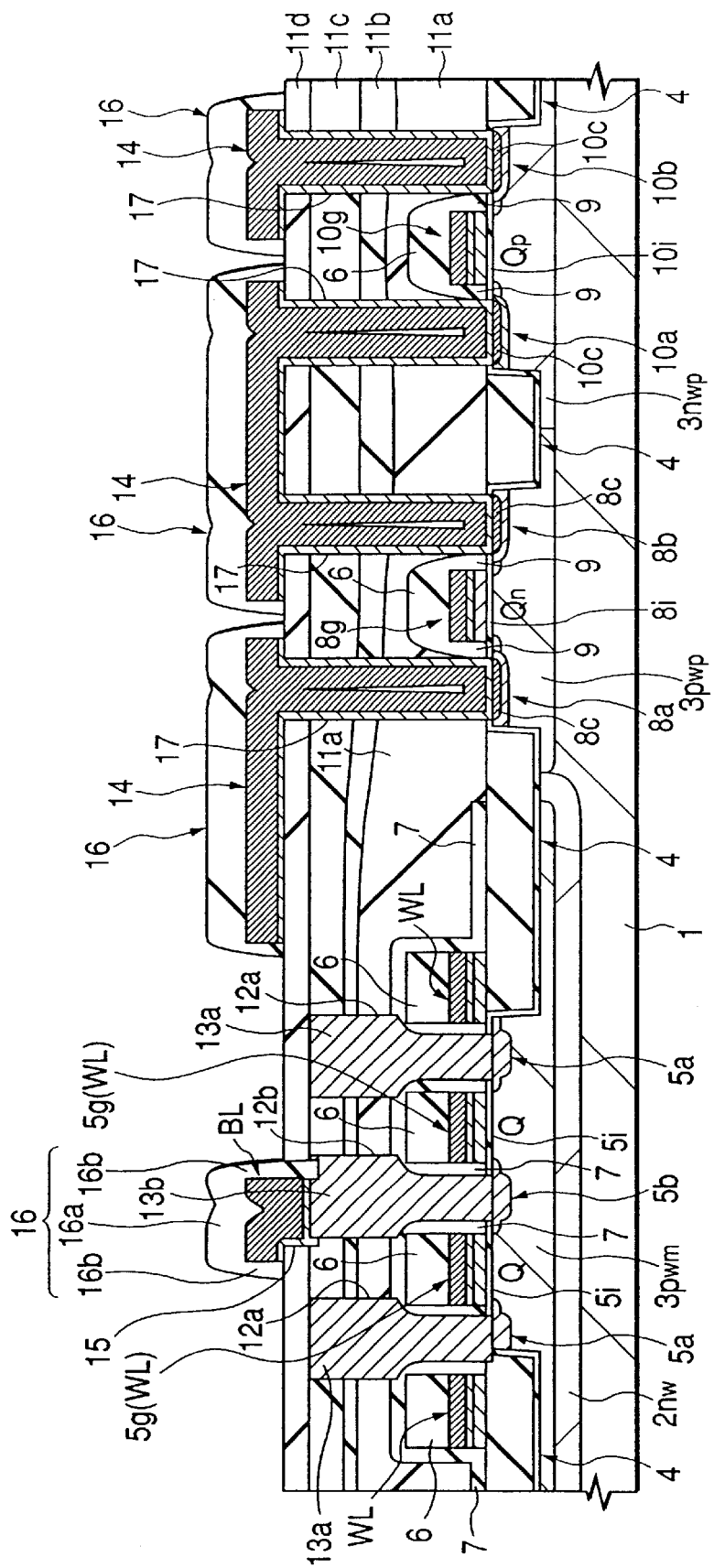

Subsequently, the photoresist 32j is removed, and an insulating film made of, for example, silicon nitride ($Si_3N_4$) is deposited on the semiconductor substrate 1. Further, the insulating film is etched back, whereby side walls 16b are formed on the side surfaces of the bit line BL and the first-layer wiring lines 14 as shown in FIG. 29.

Figure 30:
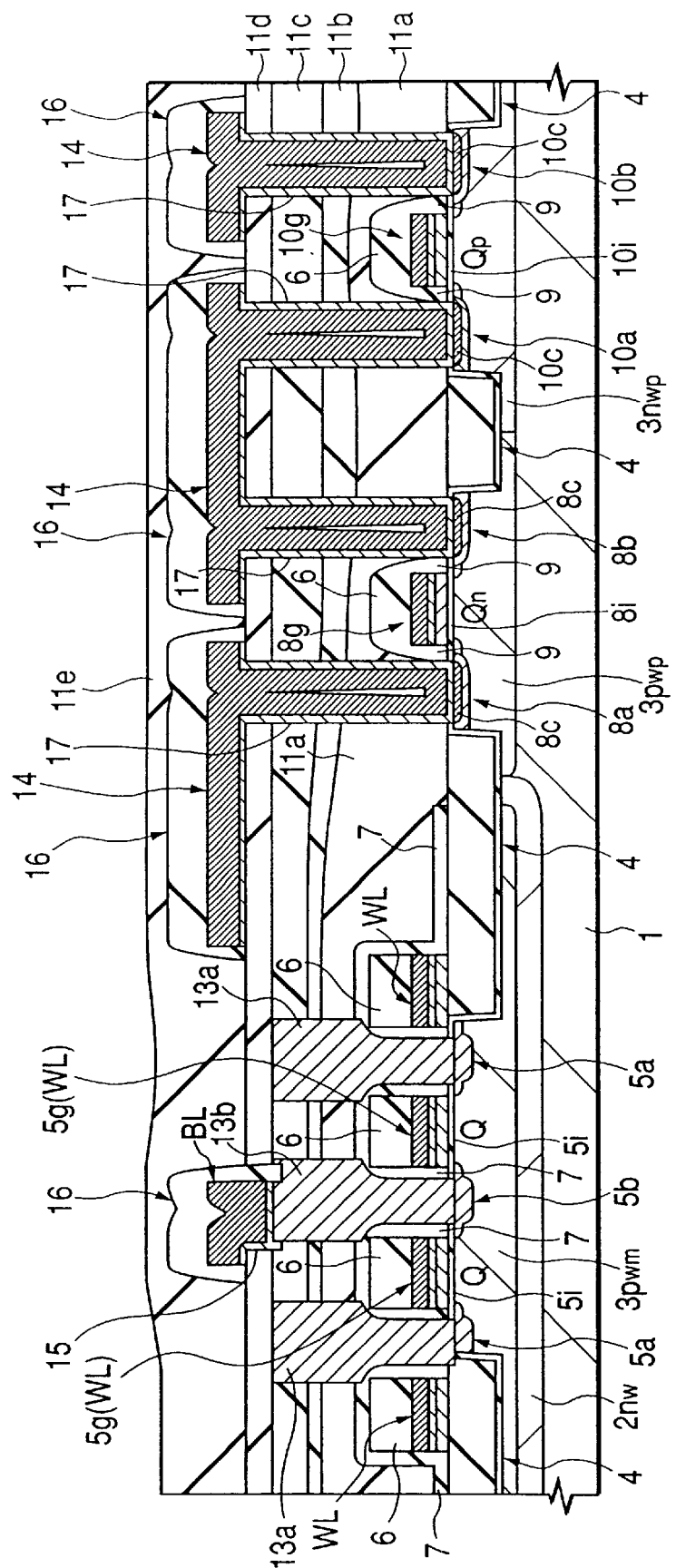

Subsequently, as shown in FIG. 30, an interlayer insulating film 11e made of, for example, silicon dioxide ($SiO_2$) is deposited by SOG or the like, thereby to cover the bit line BL and the first-layer wiring lines 14.

Figure 31:
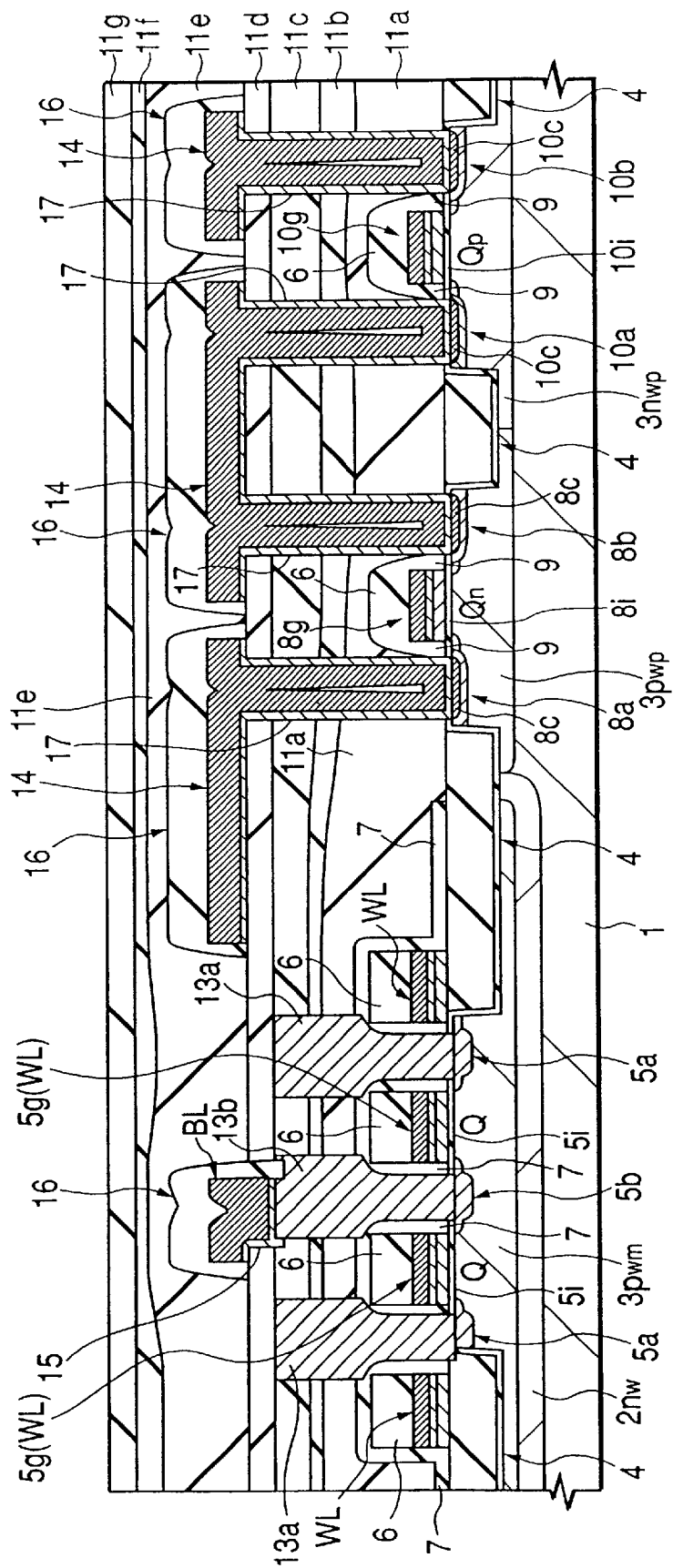

Thereafter, an insulating film made of silicon dioxide ($SiO_2$) or the like is deposited on the interlayer insulating film 11e by, for example, plasma CVD employing TEOS gas, and the upper part thereof is etched back by CMP or the like. Thus, as shown in FIG. 31, an interlayer insulating film 11f is formed on the interlayer insulating film 11e.

Thereafter, an interlayer insulating film 11g made of silicon dioxide ($SiO_2$) or the like is formed on the interlayer insulating film 11f by, for example, plasma CVD employing TEOS gas. The interlayer insulating film 11g functions to cover damage etc. which has occurred at the upper part of the interlayer insulating film 11f by the CMP step. The upper surface of the interlayer insulating film 11g is flattened so that its height may substantially agree in the memory domain and the logic domain.

Figure 32:
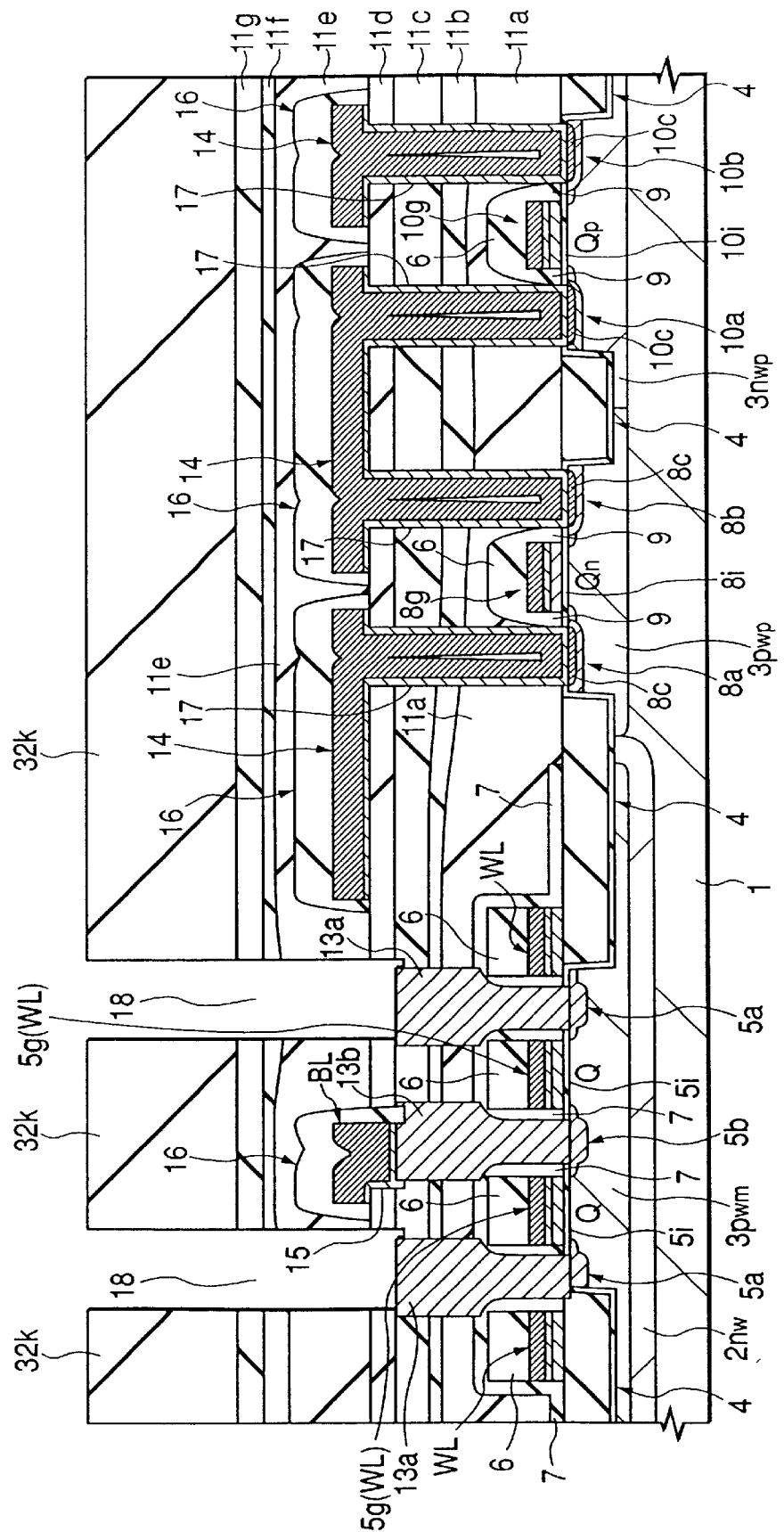

Subsequently, as shown in FIG. 32, photoresist 32k by which contact holes for plugs are denuded is formed on the interlayer insulating film 11g. On this occasion, since the upper surface of the interlayer insulating film 11g is flattened in this embodiment, a sufficient photolithographic margin can be secured, and a good pattern transfer is possible.

Thereafter, the contact holes 18 by which the upper surfaces of the plugs 13a are denuded are provided in the interlayer insulating films 11d~11g with an etching mask, which is formed by the photoresist 32k. Then, the photoresist 32k is removed.

On this occasion, in this embodiment, the etching process is carried out under conditions under which the etching rate of the silicon nitride ($Si_3N_4$) film becomes greater than that of the silicon dioxide ($SiO_2$) film. Thus, the surface of the bit line BL is formed with the insulating film 16 made of silicon nitride ($Si_3N_4$). Accordingly, even when the pattern of the contact holes 18 has come to overlap the bit line BL in plan due to the relative positional deviation between the contact hole 18 and the plug 13a, the insulating film 16 functions as an etching stopper. It is therefore possible to prevent the bit line BL from being exposed through the contact hole 18.

Figure 33:
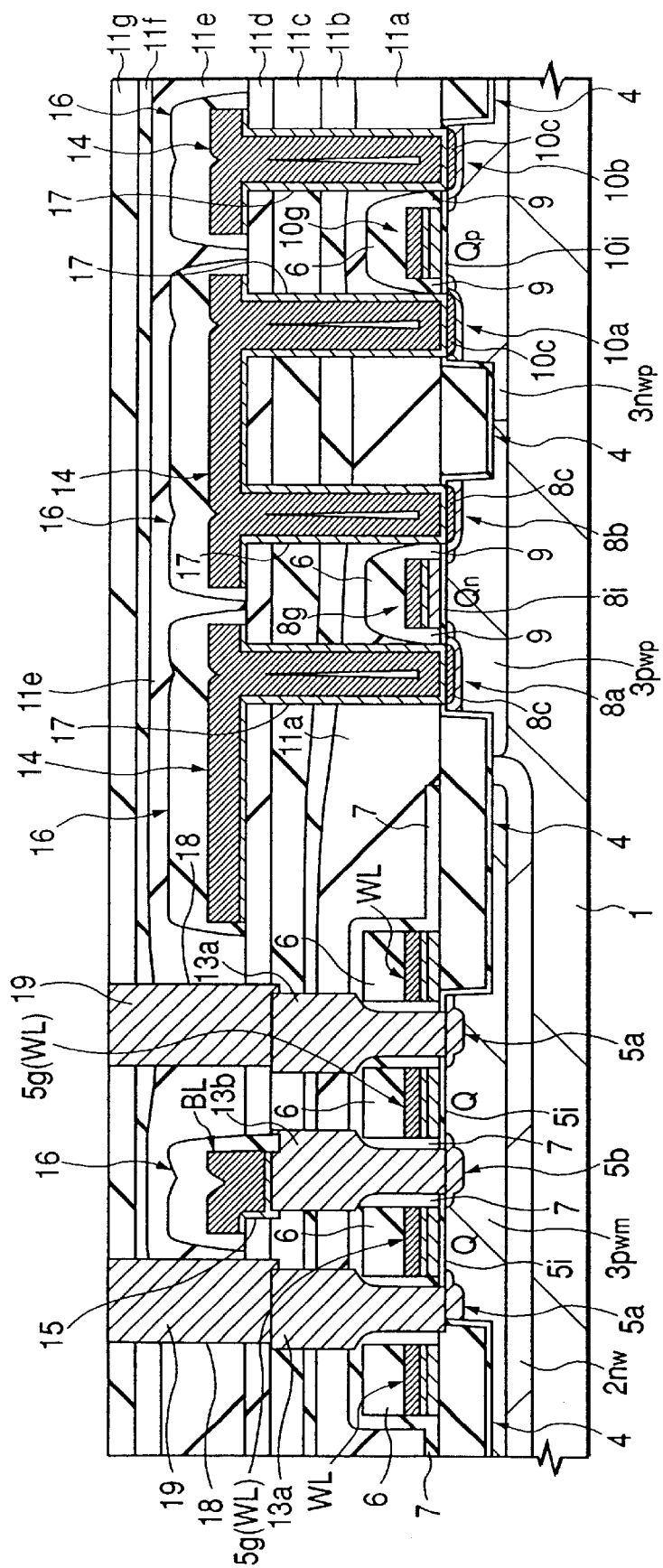

Next, a conductor film made of, for example, low-resistance polysilicon is deposited on the resultant semiconductor substrate 1 by CVD or the like, and it is etched back so as to be left in the contact holes 18 only. Thus, the plugs 19 are formed in the contact holes 18 as shown in FIG. 33.

Figure 34:
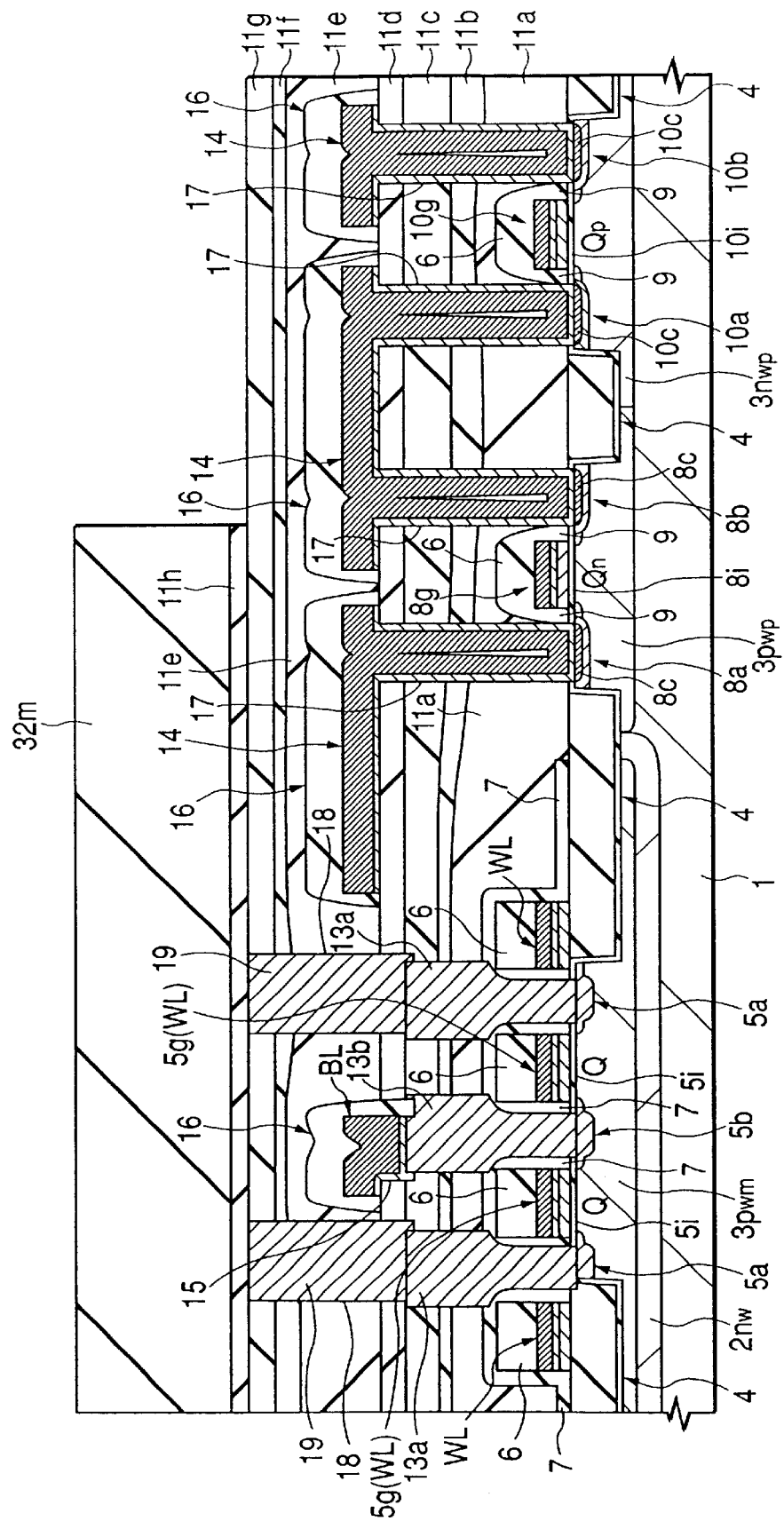

Subsequently, as shown in FIG. 34, an insulating film 11h made of, for example, silicon nitride ($Si_3N_4$) is deposited on the resultant semiconductor substrate 1 by CVD or the like. Further, photoresist 32m which covers the memory domain is formed on the insulating film 11h, and this insulating film 11h is patterned by etching with an etching mask, which is formed by the photoresist 32m.

Figure 35:
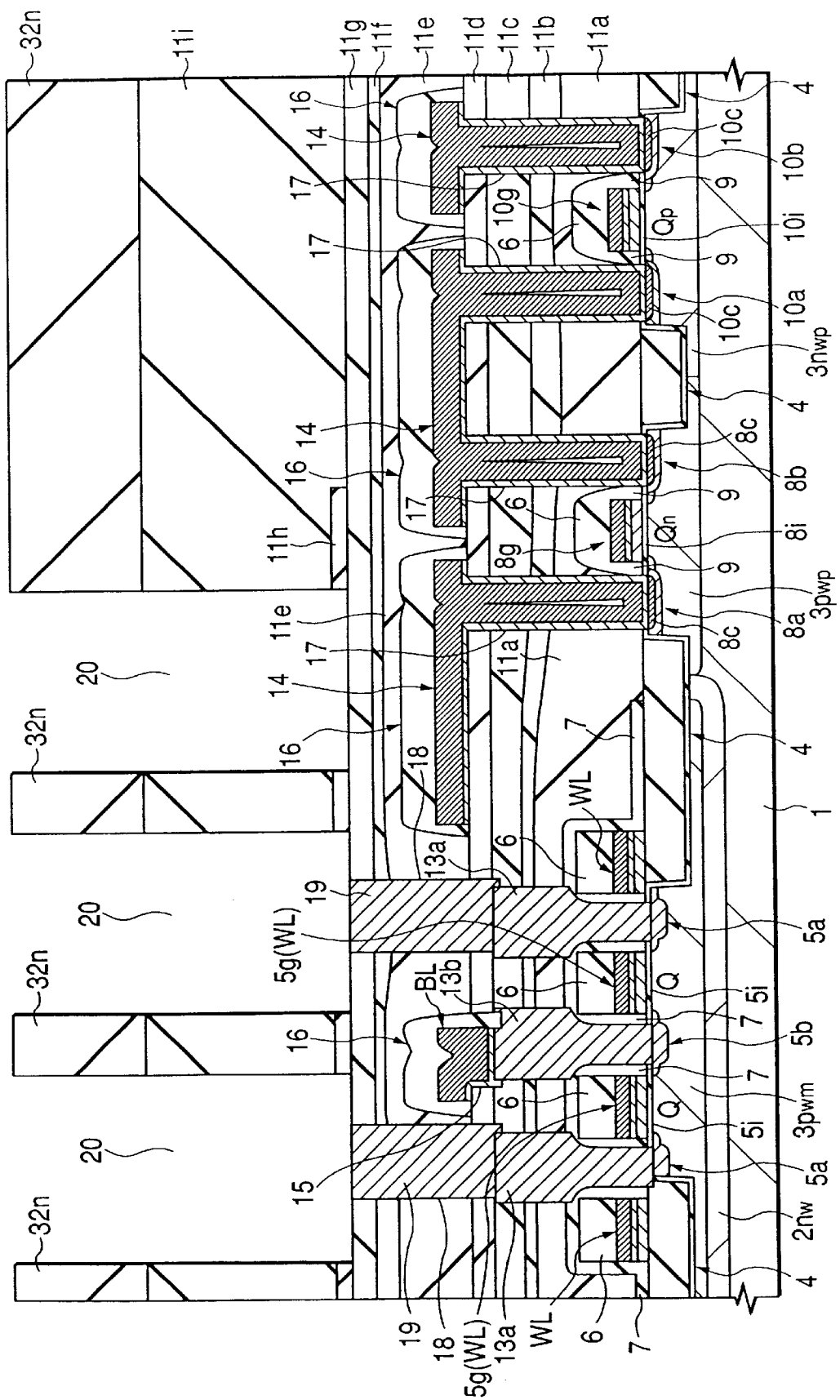

After the removal of the photoresist 32m, as shown in FIG. 35, an interlayer insulating film 11i made of silicon dioxide ($SiO_2$) or the like is formed on the resultant semiconductor substrate 1 by, for example, plasma CVD employing TEOS gas.

Subsequently, photoresist 32n for forming a capacitor is formed on the interlayer insulating film 11i. Further, using the photoresist 32n as an etching mask, those parts of the interlayer insulating films 11i and 11h which are exposed through the photoresist 32n are removed, thereby to form openings 20 by which the upper surfaces of the plugs 19 are denuded.

Figure 36:
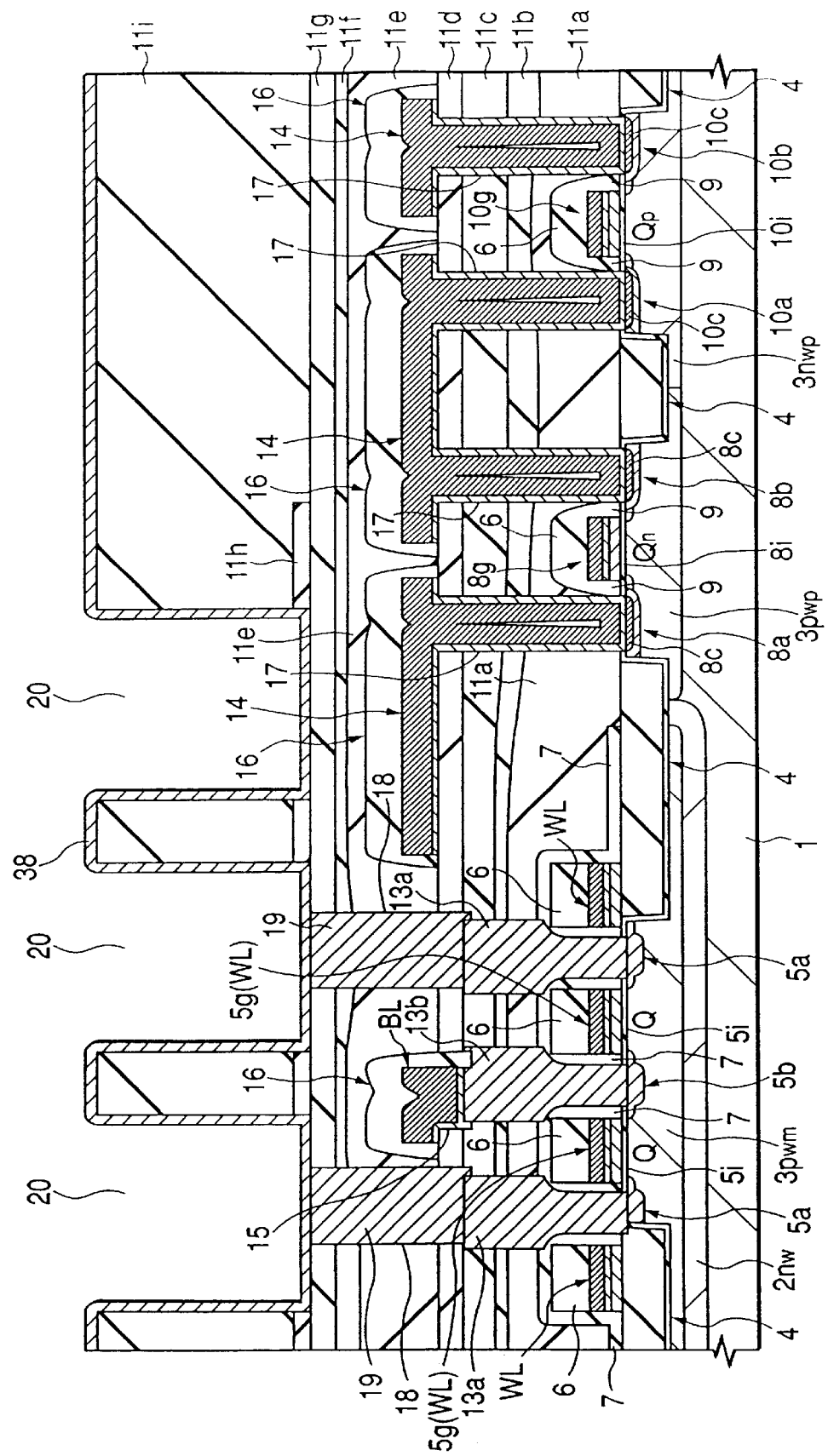

Subsequently, as shown in FIG. 36, a conductor film 38 made of, for example, low-resistance polysilicon is deposited on the resultant semiconductor substrate 1 by CVD or the like. Thus, the conductor film 38 is deposited on the upper surface of the interlayer insulating film 11i and the inner surfaces of the openings 20.

Figure 37:
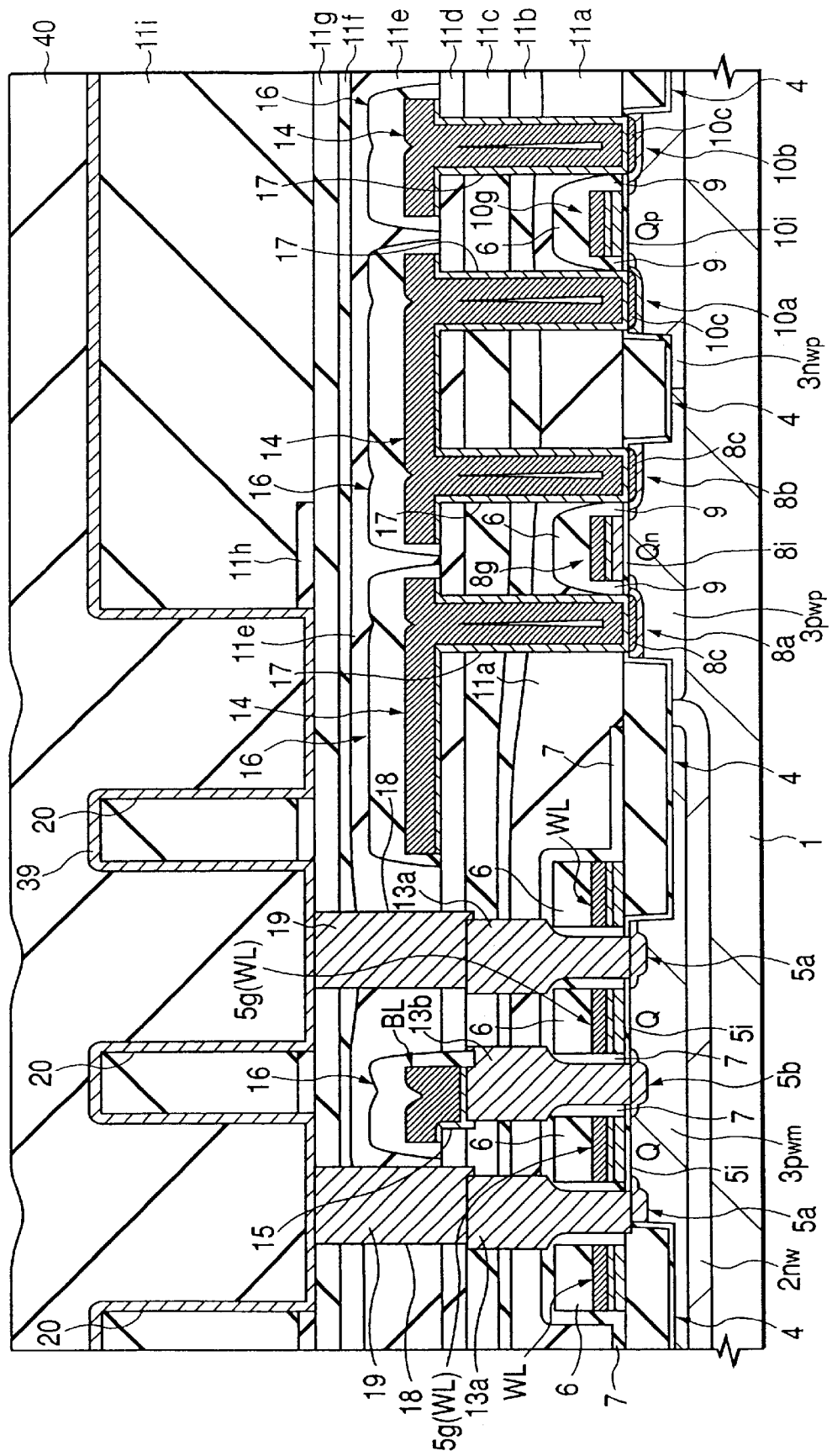

Thereafter, as shown in FIG. 37, an insulating film 39 made of, for example, silicon dioxide ($SiO_2$) is deposited on the resultant semiconductor substrate 1 by SOG or the like. Here, the insulating film 39 is deposited to the extent that its upper surface is substantially flattened.

Figure 38:
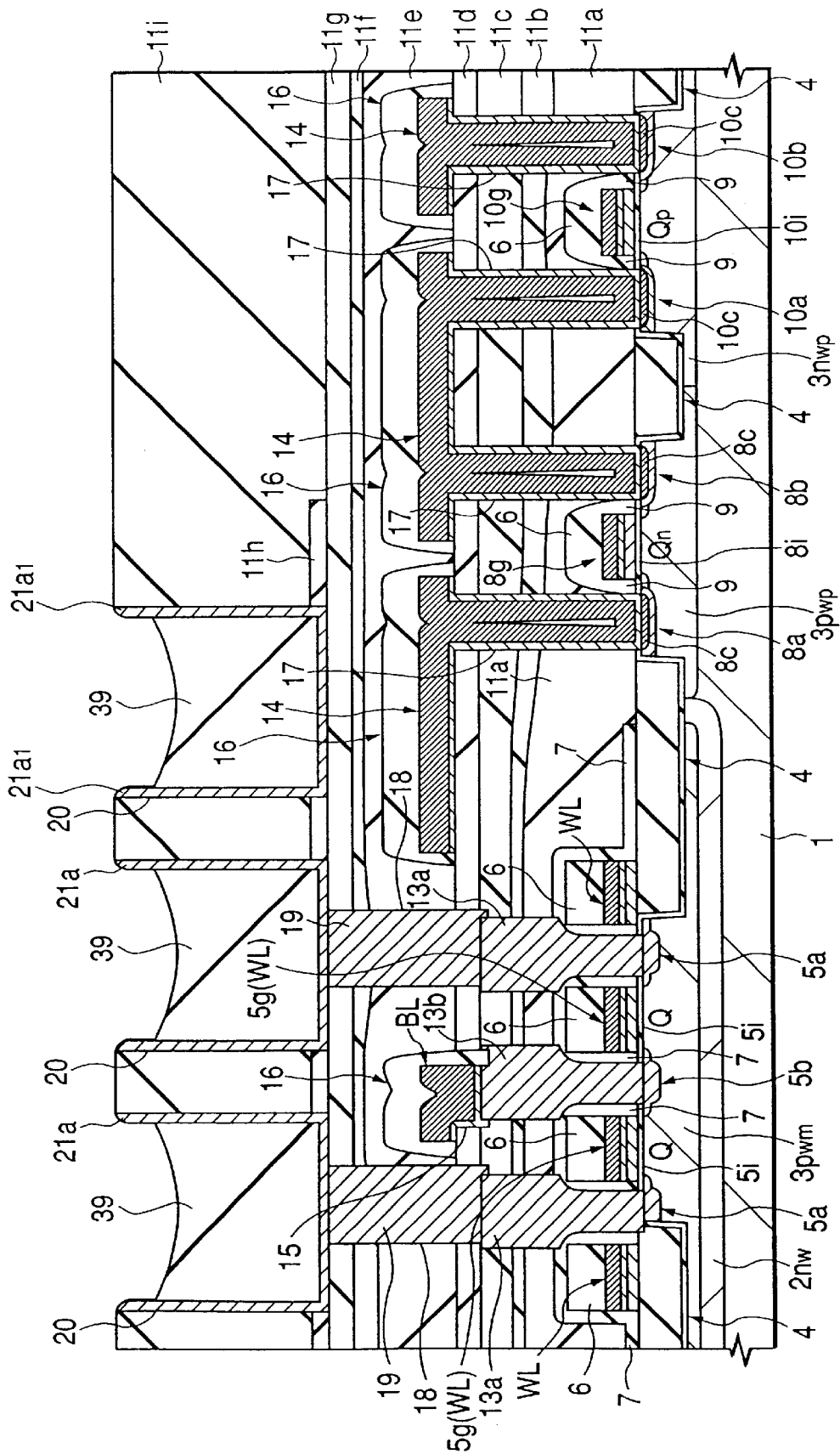

Next, the insulating film 39 is etched and removed to the extent that the conductor film 38 on the interlayer insulating film 11i is denuded, and the denuded conductor film 38 is etched back. Thus, as shown in FIG. 38, storage electrodes 21a and a dummy storage electrode $21a_1$ made of low-resistance polysilicon are formed in the openings 20.

Figure 39:
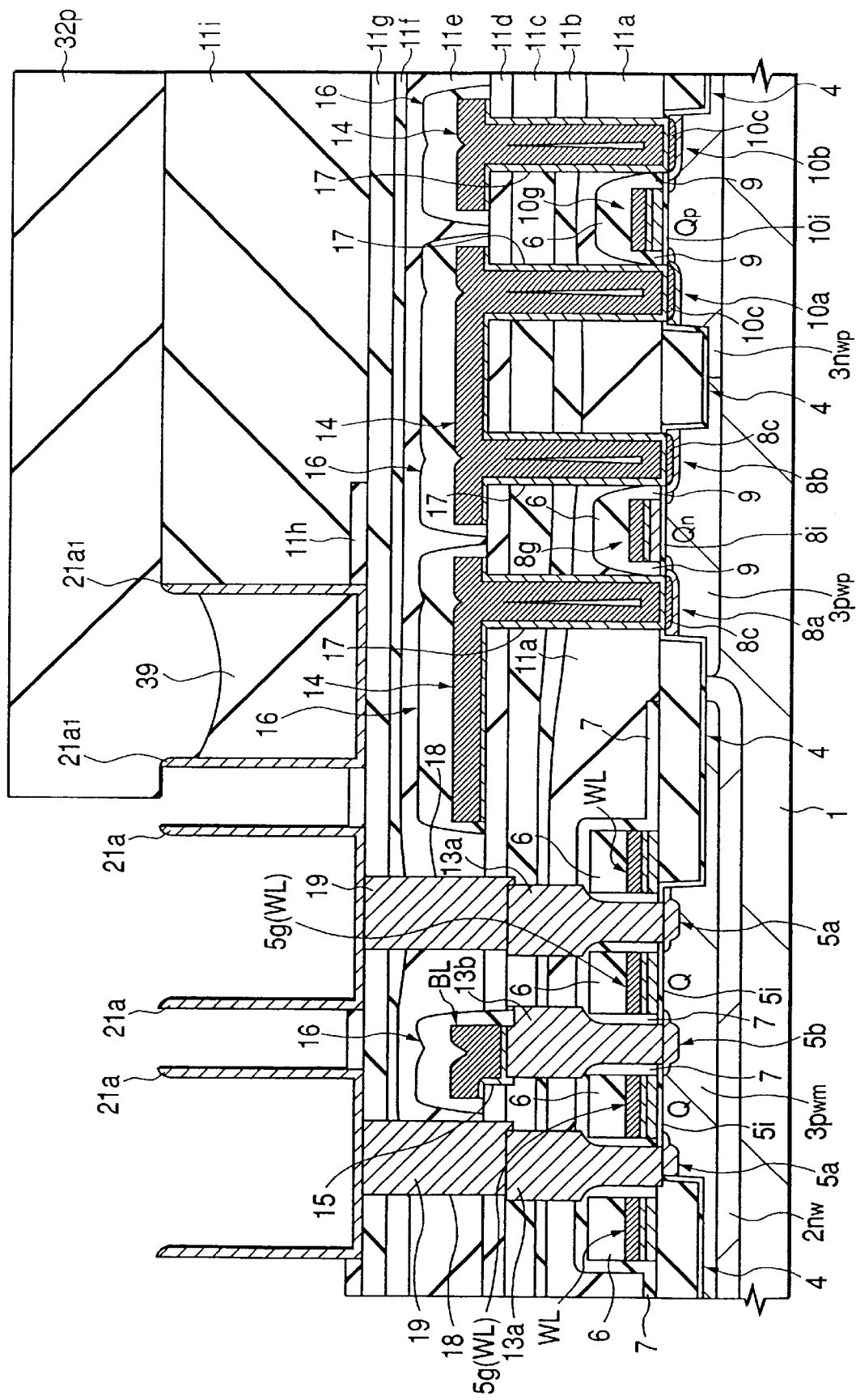

Subsequently, as shown in FIG. 39, photoresist 32p which covers the dummy storage electrode $21a_1$ and the logic domain is formed on the resultant semiconductor substrate 1, and the interlayer insulating film 11i is removed by wet etching with the photoresist 32p employed as an etching mask, thereby to denude the surfaces of the storage electrodes 21a. On this occasion, the interlayer insulating film 11h functions as an etching stopper in the wet etching process and also as members for fixing the storage electrodes 21a.

Besides, the end part of the photoresist 32p is arranged on the boundary between the memory domain and the logic domain, that is, the dummy storage electrode $21a_1$. In this way, even when misregistration has occurred at the end part of the photoresist 32p, the insulating film is prevented from remaining in the outermost storage electrode 21a in the memory domain, and the interlayer insulating film 11i in the logic domain is prevented from being etched.

Figure 40:
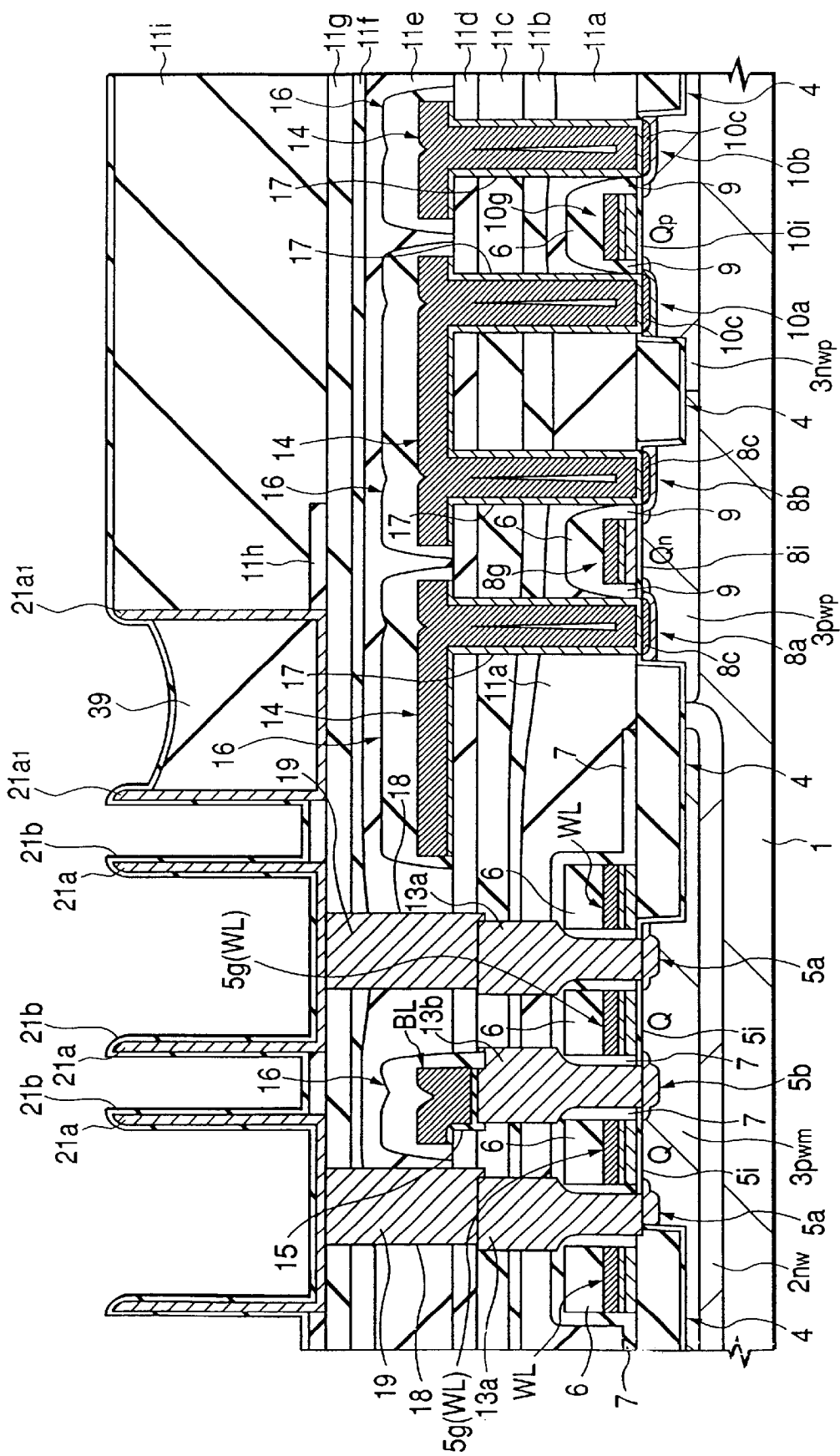

After the removal of the photoresist 32p, as shown in FIG. 40, the surface of each storage electrode 21a is nitrided, and it is further covered with a capacitance insulating film 21b which is made of, for example, tantalum pentoxide ($Ta_2O_5$).

Figure 41:
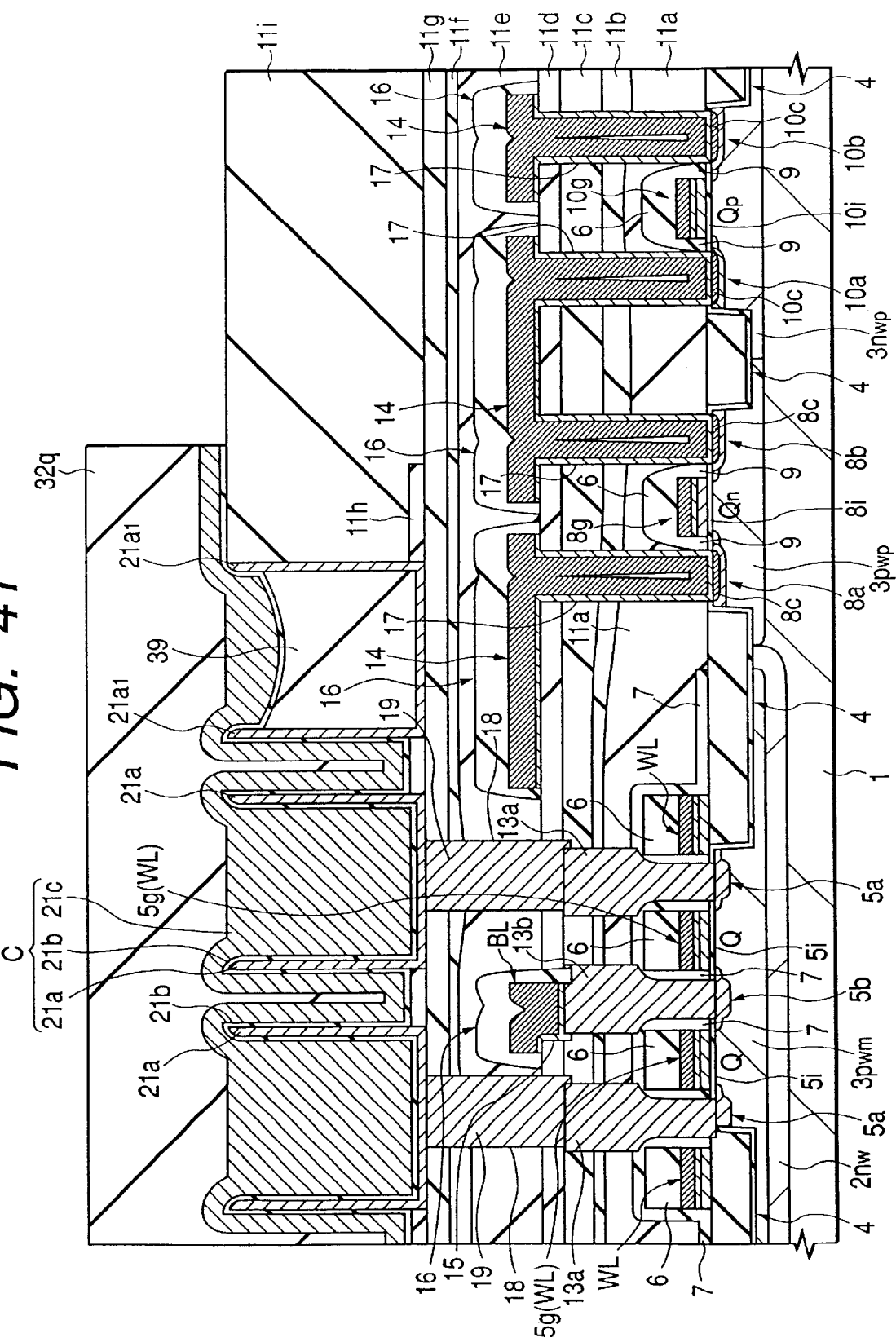

Next, as shown in FIG. 41, a conductor film made of, for example, titanium nitride (TiN) is deposited on the resultant semiconductor substrate 1, and it is patterned using an etching mask, which is formed by the photoresist 32q, for forming plate electrodes which overlie the conductor film, thereby to form the plate electrodes 21c. Thus, the information storing capacitors C are formed.

Figure 42:
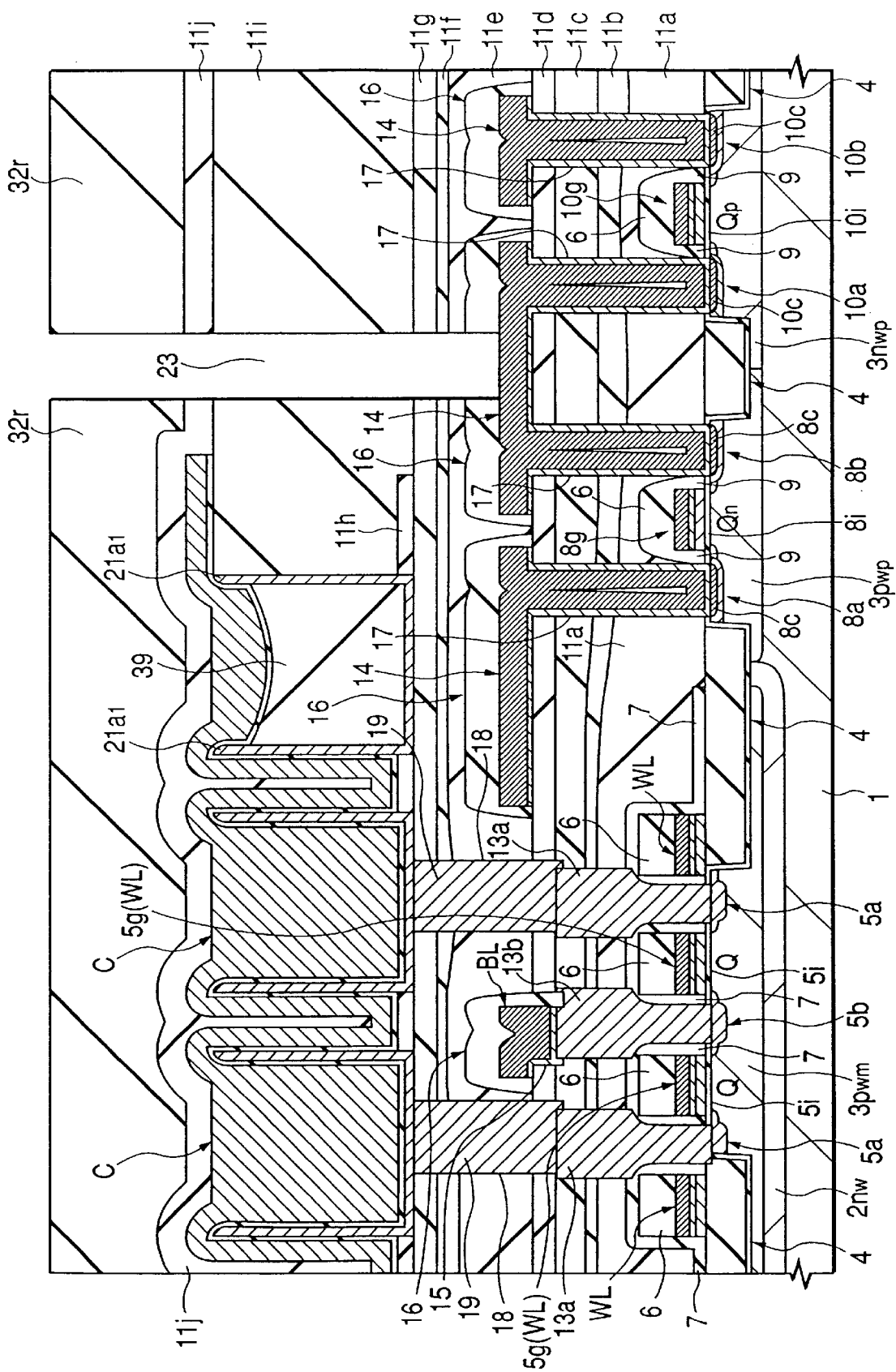

After the removal of the photoresist 32q, as shown in FIG. 42, an interlayer insulating film 11j made of silicon dioxide ($SiO_2$) or the like is formed on the resultant semiconductor substrate 1 by, for example, plasma CVD employing TEOS gas. Thus, the plate electrodes 21c are covered.

Thereafter, photoresist 32r for forming the contact hole of the logic circuit is formed on the interlayer insulating film 11j, and the contact hole 23 by which part of the first-layer wiring line 14b is denuded is provided using the photoresist 32r as an etching mask.

Figure 43:
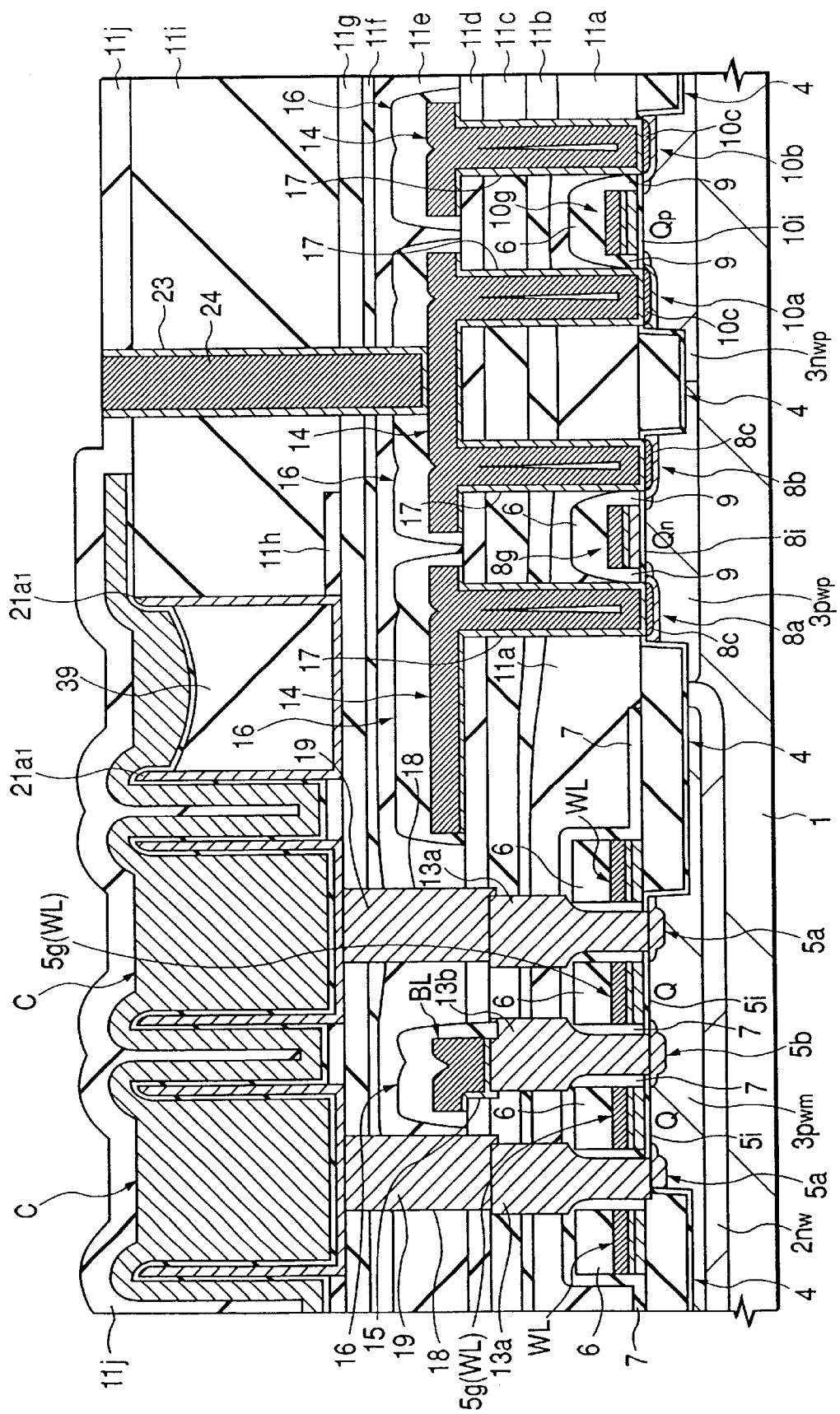

After the removal of the photoresist 32r, titanium nitride (TiN) and tungsten (W), for example, are deposited on the resultant semiconductor substrate 1 by sputtering or the like in the order from below, and they are etched back. Thus, as shown in FIG. 43, a conductor film 24 is buried in the contact hole 23.

Subsequently, titanium nitride (TiN), aluminum (Al) and titanium (Ti), for example, are deposited on the resultant semiconductor substrate 1 by sputtering or the like in this order from below, and they are patterned by photolithography and dry etching. Thus, second-layer wiring lines 22 are formed on the interlayer insulating film 11j as shown in FIG. 44.

Thereafter, third-layer wiring lines 25 are formed on the resultant semiconductor substrate 1 via wiring forming steps similar to the forming steps of the second-layer wiring lines 22, and a DRAM is produced as shown in FIG. 1.

FIGS. 45(a) and 45(b) are graphs each showing an impurity concentration profile in a depthwise direction at the interface between the semiconductor region of the storage node of a memory cell selecting MIS.FET and an element isolation region. Herein, FIG. 45(a) corresponds to a memory cell selecting MIS.FET of $n^+$ gate in the prior art, and FIG. 45(b) corresponds to the memory cell selecting MIS.FET of $p^+$ gate in this embodiment.

With the memory cell selecting MIS.FET of $n^+$ gate in the prior art, an impurity needs to be introduced into a channel region, and hence, the impurity concentration at the junction between the semiconductor region of the storage node and the semiconductor substrate is as high as $10^{18}$ [$cm^{-3}$]. In contrast, with the memory cell selecting MIS.FET of $p^+$ gate in this embodiment, no impurity need be introduced into a channel region, and hence, the impurity concentration at the above junction is as low as about $5 \times 10^{16}$ [$cm^{-3}$]. It is accordingly possible to lower the electric field intensity at the junction.

As described above, according to this embodiment, the following effects can be attained:

(1) The conductivity type of low-resistance polysilicon constituting the gate electrode 5g of a memory cell selecting MIS.FET Q is set at the p-type, whereby the threshold voltage of the memory cell selecting MIS.FET Q can be increased without raising the impurity concentration of the semiconductor substrate 1 (that is, the impurity concentration of a p-well $3pw_m$: "substrate concentration").

(2) Since the part of the semiconductor substrate 1 underlying an element isolation region 4 need not be formed with a p-type impurity region for preventing inversion, the electric field of a junction near the interface between the element isolation region 4 and that semiconductor region 5a of the memory cell selecting MIS.FET Q to which a capacitor C is connected can be moderated.

(3) Owing to the item (1), the substrate concentration can be lowered, and hence, an electric field near the junction of the semiconductor region 5a to which the capacitor C is connected can be moderated. It is therefore possible to reduce the leakage current between a storage node and the semiconductor substrate 1.

(4) Owing to the item (1), the substrate concentration can be lowered, and hence, the subthreshold current of the memory cell selecting MIS.FET Q can be reduced. It is therefore possible to reduce the leakage current of the MIS.FET even for the same threshold voltage.

(5) Owing to the items (2), (3) and (4), the refresh characteristics of a memory cell can be enhanced.

(6) The thickness of each of the gate insulating films 8*i* and 10*i* of a MIS.FET Qn of n-channel type and a MIS.FET Qp of p-channel type for a logic circuit is set to be less than the thickness of the gate insulating film 5*i* of the memory cell selecting MIS.FET Q, whereby the driving capability of each of the n-channel type MIS.FET Qn and the p-channel type MIS.FET Qp for the logic circuit can be enhanced.

(7) owing to the item (1), it is possible to dispense with the step of ion-implanting any impurity into the channel region of the p-well 3*pw*$_m$.

(8) In introducing a p-type impurity into the gate electrode forming region of the memory cell selecting MIS.FET Q, within a polysilicon film 34 for forming gate electrodes, the impurity is also introduced into the gate electrode forming region of the p-channel type MIS.FET Qp for the logic circuit by employing an identical photoresist as a mask. Thus, the number of steps need for forming photoresist patterns can be made smaller than in the case of carrying out the impurity introducing steps separately.

(9) Owing to the items (7) and (8), the process for producing a DRAM can be simplified. It is therefore possible to shorten the time periods needed for developing and producing a semiconductor integrated circuit device, and to further curtail the cost of the semiconductor integrated circuit device including the DRAM.

Thus far, the invention made by the inventors has been concretely described on the basis of various embodiments thereof. Needless to say, however, the present invention is not restricted to the foregoing embodiments, but it is variously alterable within a scope not departing from the purport thereof.

By way of example, the embodiments have been described concerning a case where each of the gate electrodes of a memory cell selecting MIS.FET and a MIS.FET on a semiconductor substrate is endowed with a structure in which at least one metal film is stacked on a polysilicon film, but the present invention is not restricted to such a structure. The gate electrode may well have, for example, a simple substance film of polysilicon, or a structure in which a silicide film of tungsten silicide or the like is stacked on the polysilicon film.

Besides, the foregoing embodiments have been described concerning a case where a capacitance element for storing information is disposed over a bit line. However, such a structure is not restrictive, but the information storing capacitance element may well be disposed under the bit line.

Further, the foregoing embodiments have been described concerning a case where the information storing capacitance element is in the shape of a crown. However, such a shape is not restrictive, but the information storing capacitance element may well be in the shape of, for example, a fin.

In the above, the invention made by the inventors has been chiefly described in relation to the application thereof to DRAM techniques forming the background field of utilization, but it is not restricted to DRAM techniques. By way of example, the present invention is also applicable to SRAM techniques pertinent to a memory cell which includes a flip-flop circuit and a transfer MIS transistor of n-channel type, the flip-flop circuit including a load MIS transistor of p-channel type and a drive MIS transistor of n-channel type, or to SRAM techniques pertinent to a memory cell which includes a flip-flop circuit and a transfer MIS transistor of n-channel type, the flip-flop circuit including a load resistance element and a drive MIS transistor of n-channel type.

Effects which are brought forth by typical aspects of performance of the present invention are briefly summarized below.

(1) According to the semiconductor integrated circuit device of the present invention, the conductivity type of the gate polysilicon electrode (polycrystalline silicon held in contact with a gate insulating film) of the MIS transistor of a memory cell constituting a memory circuit is set opposite to that of semiconductor regions for the source and drain of the MIS transistor of the memory cell, so that the threshold voltage of the MIS transistor of the memory cell can be increased without raising the impurity concentration of a semiconductor substrate.

(2) According to the semiconductor integrated circuit device of the present invention, an element isolation region for defining that active region of a semiconductor substrate in which the MIS transistor of a memory cell constituting a memory circuit is formed is so formed that an isolation film is buried in a isolation groove formed in the semiconductor substrate. Therefore, an impurity region, which has the same conductivity type as that of the semiconductor substrate and which serves to prevent inversion, need not be formed in the part of the semiconductor substrate underlying the element isolation region. It is accordingly possible to moderate the electric field of a junction near the interface between the element isolation region and the semiconductor region of the storage node of the memory cell.

(3) Owing to the item (1), the impurity concentration of the semiconductor substrate in a memory circuit domain can be lowered, so that an electric field near the junction of the semiconductor region of a storage node can be moderated in the MIS transistor of the memory cell. It is therefore possible to reduce the leakage current between the storage node and the semiconductor substrate.

(4) Owing to the item (1), the impurity concentration of the semiconductor substrate in a memory circuit domain can be lowered, so that the subthreshold current of the MIS transistor of the memory cell can be reduced. It is therefore possible to reduce the leakage current of the MIS transistor of the memory cell even for the same threshold voltage.

(5) Owing to the items (2), (3) and (4), the refresh characteristics of the memory cell can be enhanced.

(6) The thickness of the gate insulating film of a MIS transistor constituting a logic circuit is set small relative to that of the gate insulating film of a MIS transistor of a memory cell constituting a memory circuit, whereby the driving capability of the MIS transistor for the logic circuit can be enhanced.

(7) Owing to the item (1), it is possible to dispense with the step of ion-implanting any impurity into the channel region of the MIS transistor of the memory cell constituting the memory circuit.

(8) According to the present invention, a method of producing a semiconductor integrated circuit device which has a logic/memory hybrid type memory, wherein a memory circuit and a logic circuit are disposed on an identical semiconductor substrate, comprises the step of introducing an impurity which exhibits a conductivity type opposite to that of semiconductor regions for the source and drain of the MIS transistor of a memory cell constituting the memory circuit, into the gate electrode forming region of the MIS transistor of the memory cell, within a polycrystalline silicon film which is used for forming gate electrodes and which is deposited on the semiconductor substrate. At the step of introducing the impurity into the gate electrode forming region within the polycrystalline silicon film, the impurity is simultaneously introduced into the gate electrode forming region of a MIS transistor other than the MIS transistor of the memory cell, within the polycrystalline silicon film.

Thus, the number of the steps of forming photoresist patterns can be made smaller than in the case of carrying out the impurity introducing steps separately.

(9) Owing to the items (7) and (8), a process for producing the semiconductor integrated circuit device which has the logic/memory hybrid type memory can be simplified. It is therefore possible to shorten the time periods for developing and producing a semiconductor integrated circuit device, and to further curtail the cost of the semiconductor integrated circuit device including the logic/memory hybrid type memory.

What is claimed is:

1. A semiconductor integrated circuit device having a memory cell, which includes a first MIS.FET and a capacitance element, and a second MIS.FET, comprising:
   (a) a semiconductor substrate whose surface includes a first semiconductor region of first conductivity type, and a second semiconductor region of the first conductivity type in a region different from said first semiconductor region;
   (b) third semiconductor regions of second conductivity type which are formed in said first semiconductor region, and which function as a source and a drain of said first MIS.FET, respectively;
   (c) a first conductor layer which lies on a part of said semiconductor substrate between said third semiconductor regions, and which functions as a gate of said first MIS.FET;
   (d) fourth semiconductor regions of the second conductivity type which are formed in said second semiconductor region, and which function as a source and a drain of said second MIS.FET, respectively; and
   (e) a second conductor layer which lies on a part of said semiconductor substrate between said fourth semiconductor regions, and which functions as a gate of said second MIS.FET;
   wherein said first conductor layer has a stacked structure which includes a first polysilicon film of said first conductivity type, and a first film comprising metal, while said second conductor layer has a stacked structure which includes a second polysilicon film of said second conductivity type, and a second film comprising metal.

2. A semiconductor integrated circuit device as defined in claim 1, wherein each of the first and second films comprising metal is a tungsten film.

3. A semiconductor integrated circuit device as defined in claim 2, wherein third films comprising metal are respectively interposed between said first polysilicon film and said first film comprising metal, and between said second polysilicon film and said second film comprising metal.

4. A semiconductor integrated circuit device as defined in claim 3, wherein each of said third films comprising metal is a tungsten nitride film.

5. A semiconductor integrated circuit device as defined in claim 1, further comprising a metal silicide layer which is formed on a surface of each of said fourth semiconductor regions.

6. A semiconductor integrated circuit device as defined in claim 1, wherein a surface of said semiconductor substrate includes an active region and an element isolation region, and wherein said element isolation region is formed by burying an insulating film in an isolation groove which is formed in said surface of said semiconductor substrate.

7. A semiconductor integrated circuit device as defined in claim 1, wherein each of said first and second films comprising metal comprises a metal silicide film.

8. A semiconductor integrated circuit device as defined in claim 7, wherein said metal silicde film is a tungsten silicide film.

9. A semiconductor integrated circuit device having a memory cell, which includes a first MIS.FET and a capacitance element, and a second MIS.FET, comprising:
   (a) a semiconductor substrate whose surface includes a first semiconductor region of first conductivity type, and a second semiconductor region of the first conductivity type in a region different from said first semiconductor region;
   (b) third semiconductor regions of second conductivity type which are formed in said first semiconductor region, and which function as a source and a drain of said first MIS.FET, respectively;
   (c) a first conductor layer which lies between said third semiconductor regions, which is formed on said semiconductor substrate through a first gate insulating film, and which functions as a gate of said first MIS.FET;
   (d) fourth semiconductor regions of the second conductivity type which are formed in said second semiconductor region, and which function as a source and a drain of said second MIS.FET, respectively; and
   (e) a second conductor layer which lies between said fourth semiconductor regions, which is formed on said semiconductor substrate through a second gate insulating film, and which functions as a gate of said second MIS.FET;
   wherein said first conductor layer includes a first polysilicon film of said first conductivity type, while said second conductor layer includes a second polysilicon film of said second conductivity type; and
   a thickness of said first gate insulating film is greater than that of said second gate insulating film.

10. A semiconductor integrated circuit device as defined in claim 9, wherein said first conductor layer has a stacked structure which includes a first film comprising metal in addition to said first polysilicon film of said first conductivity type, while said second conductor layer has a stacked structure which includes a second film comprising metal in addition to said second polysilicon film of said second conductivity type.

11. A semiconductor integrated circuit device as defined in claim 10, wherein each of the first and second films comprising metal is a tungsten film.

12. A semiconductor integrated circuit device as defined in claim 11, wherein third films comprising metal are respectively interposed between said first polysilicon film and said first film comprising metal, and between said second polysilicon film and said second film comprising metal.

13. A semiconductor integrated circuit device as defined in claim 12, wherein each of said third films comprising metal is a tungsten nitride film.

14. A semiconductor integrated circuit device as defined in claim 9, further comprising a metal silicide layer which is formed on a surface of each of said fourth semiconductor regions.

15. A semiconductor integrated circuit device as defined in claim 9, wherein a surface of said semiconductor substrate includes an active region and an element isolation region, and wherein said element isolation region is formed by burying an insulating film in an isolation groove which is formed in said surface of said semiconductor substrate.

16. A semiconductor integrated circuit device having a memory cell, which includes a first MIS.FET and a capacitance element, a second MIS.FET, and a third MIS.FET, comprising:

(a) a semiconductor substrate whose surface includes a first semiconductor region of first conductivity type, and a second semiconductor region of the first conductivity type and a third semiconductor region of second conductivity type in regions different from said first semiconductor region;

(b) fourth semiconductor regions of the second conductivity type which are formed in said first semiconductor region, and which function as a source and a drain of said first MIS.FET, respectively;

(c) a first conductor layer which lies on a part of said semiconductor substrate between said fourth semiconductor regions, and which functions as a gate of said first MIS.FET;

(d) fifth semiconductor regions of said second conductivity type which are formed in said second semiconductor region, and which function as a source and a drain of said second MIS.FET, respectively;

(e) a second conductor layer which lies on a part of said semiconductor substrate between said fifth semiconductor regions, and which functions as a gate of said second MIS.FET;

(f) sixth semiconductor regions of said first conductivity type which are formed in said third semiconductor region, and which function as a source and a drain of said third MIS.FET, respectively; and (g) a third conductor layer which lies on a part of said semiconductor substrate between said sixth semiconductor regions, and which functions as a gate of said third MIS.FET;

wherein said first conductor layer has a stacked structure which includes a first polysilicon film of said first conductivity type, and a first film comprising metal; said second conductor layer has a stacked structure which includes a second polysilicon film of said second conductivity type, and a second film comprising metal; and said third conductor layer has a stacked structure which includes a third polysilicon film of said first conductivity type, and a third film comprising metal.

17. A semiconductor integrated circuit device as defined in claim 16, wherein a surface of said semiconductor substrate includes an active region and an element isolation region, and wherein said element isolation region is formed by burying an insulating film in an isolation groove which is formed in said surface of said semiconductor substrate.

18. A semiconductor integrated circuit device having a memory cell, which includes a first MIS.FET and a capacitance element, a second MIS.FET, and a third MIS.FET, comprising:

(a) a semiconductor substrate whose surface includes a first semiconductor region of first conductivity type, and a second semiconductor region of the first conductivity type and a third semiconductor region of second conductivity type in regions different from said first semiconductor region;

(b) fourth semiconductor regions of the second conductivity type which are formed in said first semiconductor region, and which function as a source and a drain of said first MIS.FET, respectively;

(c) a first conductor layer which lies between said fourth semiconductor regions, which is formed on said semiconductor substrate through a first gate insulating film, and which functions as a gate of said first MIS.FET;

(d) fifth semiconductor regions of said second conductivity type which are formed in said second semiconductor region, and which function as a source and a drain of said second MIS.FET, respectively;

(e) a second conductor layer which lies between said fifth semiconductor regions, which is formed on said semiconductor substrate through a second gate insulating film, and which functions as a gate of said second MIS.FET;

(f) sixth semiconductor regions of said first conductivity type which are formed in said third semiconductor region, and which function as a source and a drain of said third MIS.FET, respectively; and (g) a third conductor layer which lies between said sixth semiconductor regions, which is formed on said semiconductor substrate through a third gate insulating film, and which functions as a gate of said third MIS.FET;

wherein said first conductor layer includes a first polysilicon film of said first conductivity type, said second conductor layer includes a second polysilicon film of said second conductivity type, and said third conductor layer includes a third polysilicon film of said first conductivity type; and a thickness of said first gate insulating film is greater than that of each of said second gate insulating film and said third gate insulating film.

19. A semiconductor integrated circuit device as defined in claim 18, wherein a surface of said semiconductor substrate includes an active region and an element isolation region, and wherein said element isolation region is formed by burying an insulating film in an isolation groove which is formed in said surface of said semiconductor substrate.

* * * * *